(12) United States Patent
Chen et al.

(10) Patent No.: US 12,489,043 B2
(45) Date of Patent: Dec. 2, 2025

(54) RECONSTRUCTED SUBSTRATES FOR HIGH I/O COUNTS APPLICATION AND METHODS FOR FORMING THE SAME

(71) Applicant: Taiwan Semiconductor Manufacturing Company Limited, Hsinchu (TW)

(72) Inventors: Hsien-Wei Chen, Hsinchu (TW); Jing-Ye Juang, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 631 days.

(21) Appl. No.: 17/701,737

(22) Filed: Mar. 23, 2022

(65) Prior Publication Data

US 2023/0307337 A1     Sep. 28, 2023

(51) Int. Cl.
| | |
|---|---|
| *H01L 23/498* | (2006.01) |
| *H01L 21/48* | (2006.01) |
| *H01L 23/00* | (2006.01) |
| *H01L 25/065* | (2023.01) |
| *H01L 25/16* | (2023.01) |

(52) U.S. Cl.
CPC .... *H01L 23/49822* (2013.01); *H01L 21/4857* (2013.01); *H01L 21/486* (2013.01); *H01L 23/49816* (2013.01); *H01L 23/49833* (2013.01); *H01L 23/49838* (2013.01); *H01L 23/49894* (2013.01); *H01L 24/16* (2013.01); *H01L 24/32* (2013.01); *H01L 24/73* (2013.01); *H01L 25/0655* (2013.01); *H01L 25/162* (2013.01); *H01L 2224/16227* (2013.01); *H01L 2224/16237* (2013.01); *H01L 2224/32225* (2013.01); *H01L 2224/73204* (2013.01); *H01L 2924/1434* (2013.01)

(58) Field of Classification Search
None
See application file for complete search history.

(56) References Cited

U.S. PATENT DOCUMENTS

| | | | |
|---|---|---|---|
| 10,535,608 B1 * | 1/2020 | Rubin | H01L 24/17 |
| 11,164,817 B2 * | 11/2021 | Rubin | H01L 21/4853 |
| 2023/0065380 A1 * | 3/2023 | Cheah | H01L 23/5384 |

* cited by examiner

*Primary Examiner* — Long Pham
(74) *Attorney, Agent, or Firm* — The Marbury Law Group, PLLC

(57) ABSTRACT

A package assembly includes a package substrate including a molding material layer and a plurality of substrate portions embedded in the molding material layer, a redistribution layer (RDL) structure on the package substrate, and a plurality of semiconductor devices on the RDL structure.

20 Claims, 30 Drawing Sheets

US 12,489,043 B2

RECONSTRUCTED SUBSTRATES FOR HIGH I/O COUNTS APPLICATION AND METHODS FOR FORMING THE SAME

BACKGROUND

A package assembly may typically include one or more semiconductor devices (e.g., semiconductor die, system on chip (SOC) device, high bandwidth memory (HBM) device) that are mounted on a single package substrate. If a high number of input/output (I/O) terminals are designed, a large single substrate may be used to provide the high number of I/O counts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
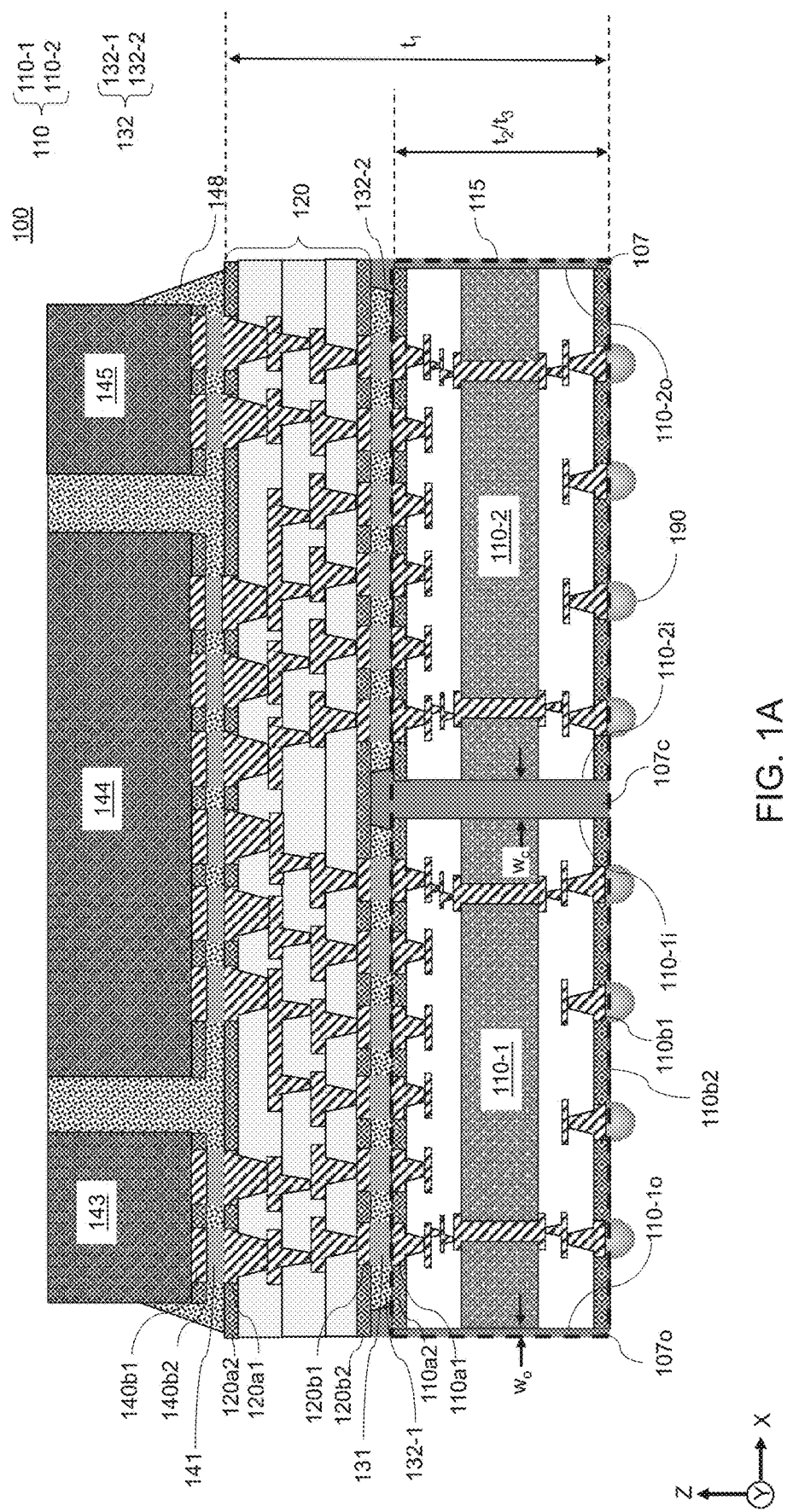
FIG. 1A is a vertical cross-sectional view of a package assembly (e.g., semiconductor package) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The cost of a large single substrate may be very high. As the cost of the large single substrate rises, the cost of fabricating a conventional package assembly that includes a large single substrate also rises. Therefore, it may be desirable to identify an alternative to the large single substrate in package assemblies.

One or more embodiments of the present disclosure may be directed to a package assembly (e.g., a high input/output (I/O)-count advanced package) that may include a package substrate (e.g., reconstructed package substrate) including a molding material layer (encapsulation layer) and a plurality of substrate portions (substrate sections) embedded in the molding material layer, a redistribution layer (RDL) structure on the package substrate, and a plurality of semiconductor devices on the RDL structure. Various embodiments disclosed herein may avoid the use of a large single substrate and, therefore, provide a more cost-effective package assembly method of fabricating the package assembly.

The package substrate may be "re-constructed" from a plurality of substrate portions (e.g., substrates or substrate sections). That is, the package substrate may have a multi-substrate structure that may have an effective enlarged size by combining a plurality of commercially-available substrates that may each have a small size (e.g., multiple small-size, low-cost & low input/output (I/O) count substrates in an embedded structure such as having a size less than 40 mm×40 mm) into a single re-constructed substrate having an effective enlarged size. Since each of the smaller individual substrates may have better yield/cost performance than a single large size substrate, the various embodiment re-constructed package substrate may have better yield performance than a single large substrate with low yield.

The embodiments may provide design flexibility and reduce an overall substrate cost. The embodiments may be especially useful in high I/O count applications. For example, more than 5000 I/O pads may be designed for a high-performance computing (HPC) application.

The plurality of substrate portions (e.g., multiple substrates) may be embedded, for example, in a molding material. In various embodiments, the re-constructed substrate may include two or more substrate portions. The two or more substrate portions may have the same or different design. The substrate portions may be formed with or without a core layer. The number of substrate portions (i.e., whether and how many more than two portions) in the package substrate may be given as n+1 (n≥1, n=int). The RDL structure may include one or more RDL layers.

The package substrate and RDL structure combined may constitute an interposer. For a plurality of substrate portions $(2 \ldots 2_{n+1}$ (n≥1, n=int)), a length $L_1$ of the interposer may be greater than the length of each of the substrate portions (e.g., $L_1 > L_2 \ldots L_{2n+1}$), a width $W_1$ of the interposer may be greater than a width of each of the substrate portions (e.g., $W_1 > W_2 \ldots W_{2n+1}$) and a thickness $t_1$ of the interposer may be greater than a thickness of each of the substrate portions (e.g., $t_1 > t_2 \ldots t_{2n+1}$).

One or more embodiments may be designed to provide a cost-effective embedded structure for a high I/O-count advanced package demand. Various embodiment embedded structures may include multiple low-cost & low I/O-count commercially available substrates that are embedded with highly flexible partitions. Various embodiment embedded structures may replace a traditional high-cost & high I/O-count single large substrate. One or more embodiments may also be combined with integrated passive devices (IPDs) such as baluns, filters, couplers, and diplexers that are used in portable, wireless and radio frequency (RF) applications.

One or more embodiments may include two distinct methods of making the package assembly (e.g., semiconductor package): the RDL-first method and the substrate-attach first method.

The RDL-first method may include solder interconnects between the plurality of substrate portions and the RDL structure. The solder interconnects may serve as a stress buffer layer. The RDL-first method may include building the RDL structure on a glass carrier, attaching the plurality of substrate portions (e.g., substrates) to the RDL structure using bump structures, forming a molding material layer around the plurality of substrate portions, bonding another glass carrier to the package substrate, inverting the intermediate structure and debonding (e.g., detaching) the glass carrier, forming a pre-solder layer (e.g., C4 pre-solder layer) on the RDL structure and debonding the other glass carrier, bonding (e.g., flip chip bonding) the semiconductor devices onto the RDL structure using bump structures (e.g., microbumps), and forming solder balls (e.g., ball grid array (BGA) mount) on a bottom of the package substrate.

The substrate-attach first method may allow for a finer pitch of interconnects (e.g., copper interconnects) between the RDL structure and the package substrate, and may include fewer process steps. The substrate-attach first method may include attaching the plurality of substrate portions to a glass carrier, forming a molding material layer around the plurality of substrate portions to form the package substrate, forming the RDL structure on the package substrate, inverting the intermediate structure and debonding the glass carrier, bonding (e.g., flip chip bonding) the semiconductor devices onto the RDL structure using bump structures (e.g., microbumps), and forming solder balls (e.g., ball grid array (BGA) mount) on a bottom of the package substrate.

FIG. 1A is a vertical cross-sectional view of a package assembly 100 (e.g., semiconductor package) according to one or more embodiments. The package assembly 100 may be formed, for example, by an RDL-first method.

As illustrated in FIG. 1A, the package assembly 100 may include a package substrate 115. The package substrate 115 may be described, for example, as a re-constructed substrate. The package substrate 115 may include a plurality of substrate portions 110. As illustrated in FIG. 1A, the plurality of substrate portions 110 may include a first substrate portion 110-1 and a second substrate portion 110-2. The first substrate portion 110-1 may have the same or different structure than the second substrate portion 110-2. The first substrate portion 110-1 may also have the same or different function than the second substrate portion 110-2.

The package substrate 115 may also include a molding material layer 107. The molding material layer 107 may be formed around and between the plurality of substrate portions 110-1 and 110-2. The molding material layer 107 may include, for example, an epoxy molding compound (EMC). Other materials for the molding material layer 107 are within the contemplated scope of this disclosure.

The molding material layer 107 may include a central molding material layer portion 107c that is formed between the first substrate portion 110-1 and the second substrate portion 110-2. The central molding material layer portion 107c may contact and adhere to an inner sidewall 110-1i of the first substrate portion 110-1 and to an inner sidewall 110-2i of the second substrate portion 110-2. The central molding material layer portion 107c may extend in the Z-direction along an entire length (i.e., along the Y-direction) of the inner sidewall 110-1i of the first substrate portion 110-1 and along an entire length of the inner sidewall 110-2i of the second substrate portion 110-2. The central molding material layer portion 107c may completely fill a space between the inner sidewall 110-1i of the first substrate portion 110-1 and the inner sidewall 110-2i of the second substrate portion 110-2. The central molding material layer portion 107c may have a width $w_c$ between the inner sidewall 110-1i of the first substrate portion 110-1 and the inner sidewall 110-2i of the second substrate portion 110-2. The width $w_c$ may be at least 0.5 mm. In some embodiments, the width $w_c$ may be 5.00 mm. In some embodiments, a larger width $w_c$ may be used. The width $w_c$ may be substantially constant in both the Y-direction and Z-direction between the inner sidewall 110-1i of the first substrate portion 110-1 and the inner sidewall 110-2i of the second substrate portion 110-2. The width $w_c$ of the central molding material layer portion 107c may constitute a distance between the inner sidewall 110-1i of the first substrate portion 110-1 and the inner sidewall 110-2i of the second substrate portion 110-2.

The molding material layer 107 may also include an outer molding material layer portion 107o that is formed around a perimeter of the first substrate portion 110-1 and the second substrate portion 110-2. In one or more embodiments, the outer molding material layer portion 107o may be formed around an entire perimeter of the first substrate portion 110-1 and the second substrate portion 110-2. The outer molding material layer portion 107o may contact and adhere to an outer sidewall 110-1o of the first substrate portion 110-1 and to an outer sidewall 110-2o of the second substrate portion 110-2. The outer molding material layer portion 107o may extend in the Z-direction along an entire length of the outer sidewall 110-1o of the first substrate portion 110-1 and along an entire length of the outer sidewall 110-2o of the second substrate portion 110-2. The outer molding material layer portion 107o may have a width $w_o$ on the outer sidewall 110-1o of the first substrate portion 110-1 and on the outer sidewall 110-2o of the second substrate portion 110-2. The width $w_o$ may be in a range from about 0.05 mm to 1.00 mm. The width $w_o$ may be substantially constant in the Z-direction along the outer sidewall 110-1o of the first substrate portion 110-1 and along the outer sidewall 110-2o of the second substrate portion 110-2.

The package substrate 115 may also include metal bonding pads 110a1 (package substrate upper bonding pads) formed on a chip-side of the package substrate 115, for providing an electrical connection to a structure (e.g., semiconductor device, semiconductor die, etc.) that is mounted on the package substrate 115. The metal bonding pads 110a1 may include, for example, copper, aluminum, or other suitable conductive materials. The metal bonding pads 110a1 may have a thickness in a range from about 1 μm to 50 μm, although thicker or thinner thicknesses may be used. A protective layer 110a2 may also be formed on the chip-side of the package substrate 115 on and around the metal bonding pads 110a1. The protective layer 110a2 may include, for example, a dielectric material such as polybenzoxazole (PBO), polyimide, benzocyclobutene (BCB), or other suitable dielectric material. A thickness of the protective layer 110a2 may substantially the same as the thickness of the metal bonding pads 110a1 so that a surface of the metal bonding pads 110a1 may be exposed through the protective layer 110a2.

The package substrate 115 may also include metal bonding pads 110b1 (package substrate lower bonding pads) formed on a board-side of the package substrate 115 that is opposite the chip-side of the package substrate 115. The metal bonding pads 110b1 may provide an electrical connection to a substrate such as a printed circuit board (PCB) on which the package assembly 100 may be mounted. The metal bonding pads 110b1 may also include, for example, copper, aluminum, or other suitable conductive materials. The metal bonding pads 110a1 may also have a thickness in a range from about 1 μm to 50 μm. A protective layer 110b2 may also be formed on the board-side of the package substrate 115 and on and around the metal bonding pads 110b1. The protective layer 110b2 may have a similar structure and function as the protective layer 110a2 described above.

A ball-grid array (BGA) including a plurality of solder balls 190 may be located on the metal bonding pads 110b1 on the board-side of the package substrate 115. The solder balls 190 may be used to securely mount the package assembly 100 to a substrate (e.g., PCB) and electrically couple the package assembly 100 to the substrate through the metal bonding pads 110b1.

The package assembly 100 may also include a redistribution layer (RDL) structure 120. The RDL structure 120 may also include, for example, a plurality of organic dielectric layers. The plurality of organic dielectric layers may include, for example, polyimide (PI), benzocyclobutene (BCB), or polybenzobisoxazole (PBO). Other suitable materials are within the contemplated scope of disclosure. A plurality of metal RDL layers (e.g., metal RDL lines and metal RDL vias) may be formed in the plurality of organic dielectric layers. The plurality of metal RDL layers may also include copper and/or another material such as Al, Mo, Co, Ru, W, TiN, TaN, WN, or a combination or a stack thereof. Other suitable materials are within the contemplated scope of disclosure. For example, each of the metal RDL layers may include a layer stack of a TiN layer and a Cu layer.

The RDL structure 120 may also include metal bonding pads 120a1 (RDL structure upper bonding pads) formed on a chip-side of the RDL structure 120, for providing an electrical connection to a structure (e.g., semiconductor device, semiconductor die, etc.) that may be mounted on the RDL structure 120. The metal bonding pads 120a1 may include, for example, copper, aluminum, or other suitable conductive materials. The metal bonding pads 120a1 may have a thickness in a range from about 1 μm to 50 μm, although thicker or thinner thicknesses may be used. A protective layer 120a2 may also be formed on the chip-side of the RDL structure 120 and on and around the metal bonding pads 120a1. The protective layer 120a2 may have a similar structure and function as the protective layer 110a2 described above.

The RDL structure 120 may also include metal bonding pads 120b1 (RDL structure lower bonding pads) formed on a board-side of the RDL structure 120 that is opposite the chip-side of the RDL structure 120. The metal bonding pads 120b1 may also include, for example, copper, aluminum, or other suitable conductive materials. The metal bonding pads 120a1 may also have a thickness in a range from about 1 µm to 50 µm, although thicker or thinner thicknesses may be used. A protective layer 120b2 may also be formed on the board-side of the RDL structure 120 and on and around the metal bonding pads 120b1. The protective layer 120b2 may have a similar structure and function as the protective layer 110a2 described above.

The RDL structure 120 may be mounted on the package substrate 115. The RDL structure 120 may be electrically coupled to the package substrate 115 through the metal bonding pads 120b1. In particular, the metal bonding pads 120b1 may be bonded to the metal bonding pads 110a1 on the chip-side of the package substrate 115, respectively.

As illustrated in FIG. 1A, the metal bonding pads 120b1 may be bonded to the metal bonding pads 110a1 by bump structures 131 (e.g., interconnect structures). The bump structures 131 may include, for example, controlled-collapse chip-connection (C4) bump structures. The bump structures 131 may include under bump metallization (UBM) such as a copper post (e.g., copper pillar) on the metal bonding pads 120b1 and/or the metal bonding pads 110al. The bump structures 131 may also include a solder joint between the metal bonding pads 120b1 and the metal bonding pads 110a1 (e.g., between the UBM and the metal bonding pads 120b1 and/or the metal bonding pads 110a1).

A package underfill layer 132 may be formed between the RDL structure 120 and the package substrate 115. The package underfill layer 132 may include a first package underfill layer 132-1 formed between the RDL structure 120 and the first substrate portion 110-1 of the package substrate 115. The package underfill layer 132 may also include a second package underfill layer 132-2 formed between the RDL structure 120 and the protective layer 110a2 in the second substrate portion 110-2 of the package substrate 115. The package underfill layer 132 may also be formed around and between the bump structures 131 so as to securely fix the RDL structure 120 to the package substrate 115. The package underfill layer 132 may include, for example, an epoxy-based polymeric material. Other suitable underfill layer materials are within the contemplated scope of disclosure.

As further illustrated in FIG. 1A, the first substrate portion 110-1 may have a thickness $t_2$ and the second substrate portion 110-2 may have a thickness $t_3$ (which may be the same as $t_2$). For example, the first substrate portion 110-1 may have a thickness that is at least 0.05 mm thick. In some embodiments, the first substrate portion 110-1 may have a thickness that is at least 1,000 mm thick. In some embodiments, a thicker first substrate portion 110-1 may be used. An interposer constituted by the package substrate 115 and the RDL structure 120 may have a thickness $t_1$ that is greater than each of the thickness $t_2$ and greater than the thickness $t_3$.

The package assembly 100 may also include a first semiconductor device 143, second semiconductor device 144, and third semiconductor device 145 (e.g., first, second and third semiconductor devices 143, 144, 145). The first semiconductor device 143, second semiconductor device 144, and third semiconductor device 145 may be mounted on the RDL structure 120. In particular, metal bonding pads 140b1 (semiconductor device lower bonding pads) may be formed on a board-side of the first semiconductor device 143, second semiconductor device 144, and third semiconductor device 145. The metal bonding pads 140b1 may be bonded to the metal bonding pads 120a1 on the chip-side of the RDL structure 120. The metal bonding pads 140b1 may include, for example, copper, aluminum, or other suitable conductive materials, and have a thickness in a range from about 1 µm to 50 µm, although thicker or thinner thicknesses may be used. A protective layer 140b2 may also be formed on a board-side of the first semiconductor device 143, second semiconductor device 144, and third semiconductor device 145. The protective layer 140b2 may be formed on and around the metal bonding pads 140a1. The protective layer 140b2 may have a similar structure and function as the protective layer 110a2 described above.

The metal bonding pads 140b1 may be bonded to the metal bonding pads 120a1, for example, bump structures 141. The bump structures 141 may include, for example, by microbump structures (e.g., microbumps) having a size that is less than a size of the bump structures 131. The bump structures 141 may also include UBM and solder joints, similar to the bump structures 131.

An interposer underfill layer 148 may be formed under and around the first semiconductor device 143, second semiconductor device 144, and third semiconductor device 145 and on the RDL structure 120. The interposer underfill layer 148 may be formed as three separate portions under the first semiconductor device 143, second semiconductor device 144, and third semiconductor device 145, respectively. Alternatively, the interposer underfill layer 148 may be formed continuously as one layer under the first semiconductor device 143, second semiconductor device 144, and third semiconductor device 145. The interposer underfill layer 148 may be formed around the bump structures 141 so as to fix the first semiconductor device 143, second semiconductor device 144, and third semiconductor device 145 to the RDL structure 120. The interposer underfill layer 148 may be formed of an epoxy-based polymeric material. Other suitable interposer underfill layer materials are within the contemplated scope of disclosure.

Although three semiconductor devices (first semiconductor device 143, second semiconductor device 144, and third semiconductor device 145) are illustrated in FIG. 1A, the package assembly 100 may include any number of semiconductor devices. In addition, each of the first semiconductor device 143, second semiconductor device 144 and third semiconductor device 145 may include, for example, a semiconductor die, a system on chip (SOC) die, a system on integrated chips (SoIC) die, and a high-bandwidth memory (HBM) die. In particular, the package assembly 100 may include a high-performance computing (HPC) application and may include, for example, an integrated graphics processing unit (GPU), application specific integrated circuit (ASIC), field-programmable gate array (FPGA), and HBM by chip on wafer on substrate (CoWoS®) technology or integrated fan-out on substrate (INFO-oS) technology. In one or more embodiments, the second semiconductor device 144 may include an SOC die, and each of the first semiconductor device 143 and third semiconductor device 145 may include an HBM die.

As illustrated in FIG. 1A, an outer sidewall of the RDL structure 120 may be substantially aligned with an outer sidewall of the package substrate 115. The outer sidewall of the RDL structure 120 may extend in the X-direction past the outer sidewall 110-1o of the first substrate portion 110-1 and past the outer sidewall 110-2o of the second substrate portion 110-2. The outer sidewall 110-1o of the first substrate portion 110-1 may extend in the X-direction past an outer sidewall of the first semiconductor device 143. The outer sidewall 110-2o of the second substrate portion 110-2 may extend in the X-direction past an outer sidewall of the third semiconductor device 145.

Figure 1B:
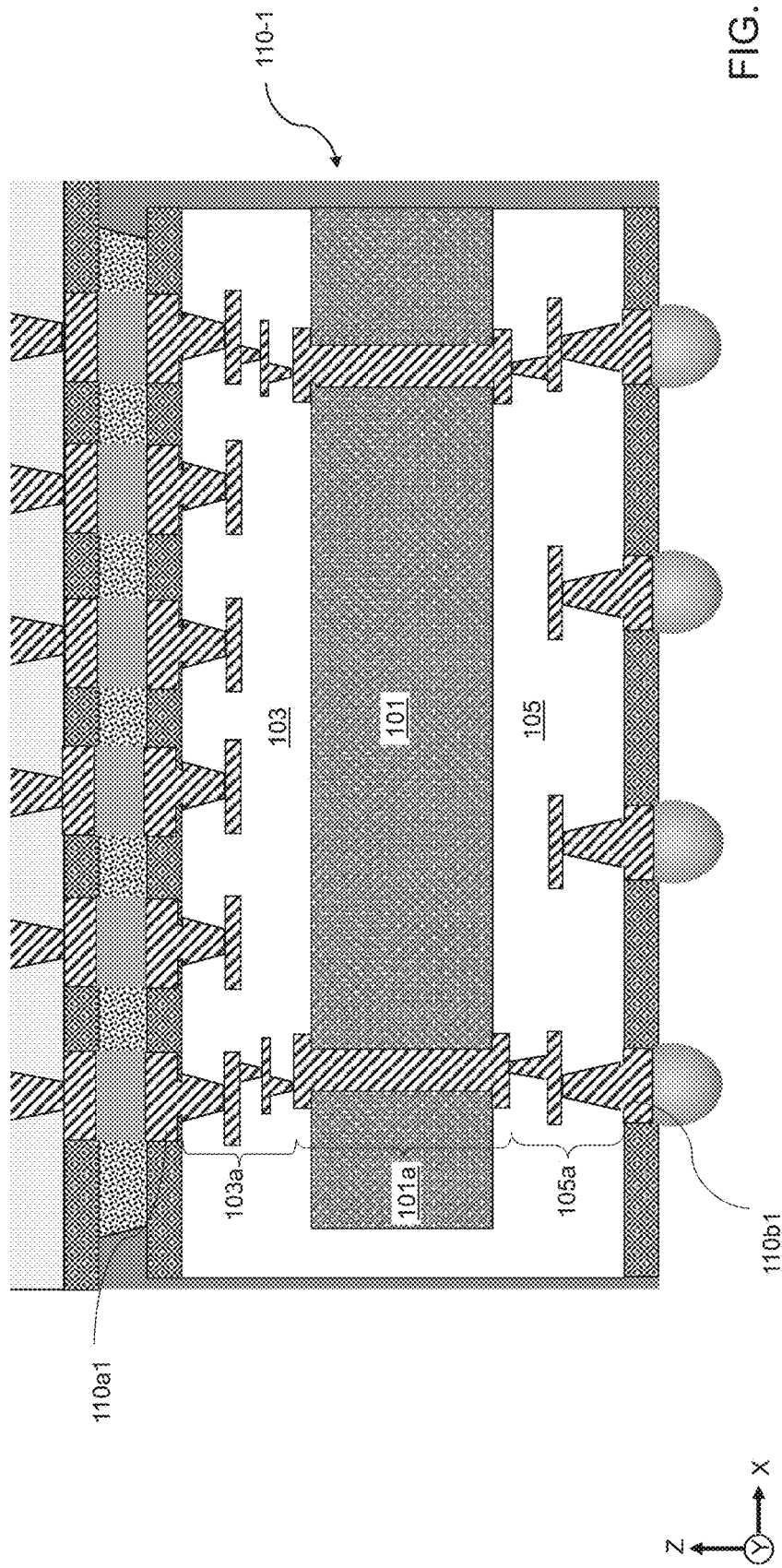
FIG. 1B is a vertical cross-sectional enlarged view of the first substrate portion, according to one or more embodiments.

FIG. 1B is a vertical cross-sectional enlarged view of the first substrate portion 110-1, according to one or more embodiments. The second substrate portion 110-2 may have a structure and function that is the same or different from the first substrate portion 110-1 illustrated in FIG. 1B.

The first substrate portion 110-1 may include any substrate that may support a package assembly including, for example, a system on integrated substrate (SoIS), a printed circuit board (PCB), etc. The first substrate portion 110-1 may include, for example, a silicon substrate or polymer substrate. In one or more embodiments, the first substrate portion 110-1 may include (e.g., optionally include) a core substrate 101. The first substrate portion 110-1 may also include an upper insulating layer 103 (e.g., chip-side insulating layer) formed on the core substrate 101, and a lower insulating layer 105 (e.g., board-side insulating layer) formed in contact with the core substrate 101 opposite the upper insulating layer 103. In one or more embodiments, the core substrate 101, upper insulating layer 103 and lower insulating layer 105 may include, for example, a dielectric polymer material such as polyimide (PI), benzocyclobutene (BCB), or polybenzobisoxazole (PBO). Other suitable dielectric materials are within the contemplated scope of disclosure.

The first substrate portion 110-1 may also include metal interconnects and through vias that may allow an electrical connection with the first substrate portion 110-a. In one or more embodiments, the metal interconnects and through vias may provide an electrical connection between the metal bonding pads 110a1 and metal bonding pads 110b1. In particular, the upper insulating layer 103 may include metal interconnect layers 103a, and the lower insulating layer 105 may include metal interconnect layers 105a. The core substrate 101 may include one or more through vias 101a that are connected to the metal interconnect layers 103a and metal interconnect layers 105a. The through vias 101a, metal interconnect layers 103a and metal interconnect layers 105a may include, one or more layers including metals, metal alloys, and/or or other metal-containing compounds (e.g., Cu, Al, Mo, Co, Ru, W, TiN, TaN, WN, etc.).

Figure 1C:
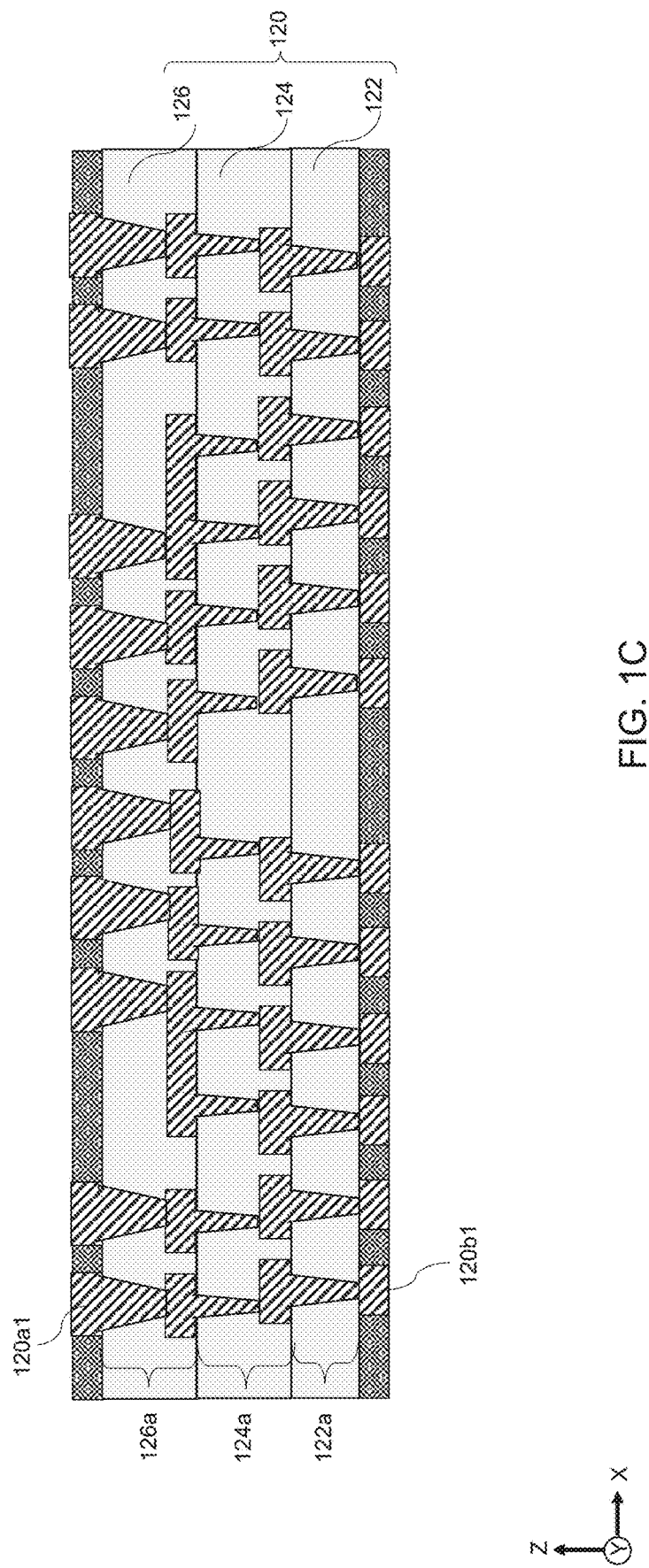
FIG. 1C is a vertical cross-sectional view of the RDL structure, according to one or more embodiments.

FIG. 1C is a vertical cross-sectional view of the RDL structure 120, according to one or more embodiments. As illustrated in FIG. 1C, the RDL structure 120 may include a plurality of dielectric layers (e.g., organic dielectric layers) including a first dielectric layer 122, a second dielectric layer 124 on the first dielectric layer 122, and a third dielectric layer 126 on the second dielectric layer 124. The first dielectric layer 122, second dielectric layer 124, and third dielectric layer 126 may include, for example, polyimide (PI), benzocyclobutene (BCB), or polybenzobisoxazole (PBO). Other suitable materials are within the contemplated scope of disclosure.

A plurality of metal RDL layers (e.g., metal RDL lines and metal RDL vias) may be formed in the plurality of organic dielectric layers. The plurality of metal RDL layers may provide an electrical connection between the metal bonding pads 120a1 and metal bonding pads 120b1. The first dielectric layer 122 may include first metal RDL layers 122a. The first metal RDL layers 122a may include metal RDL vias which may contact the metal bonding pads 120b1. The second dielectric layer 124 may include second metal RDL layers 124a which may contact the first metal RDL layers 122a. The third dielectric layer 126 may include third metal RDL layers 126a which may contact the second metal RDL layers 124a and the metal bonding pads 120a1.

The first metal RDL layers 122a, second metal RDL layers 124a, and third metal RDL layers 126a may include one or more layers including metals, metal alloys, and/or or other metal-containing compounds (e.g., Cu, Al, Mo, Co, Ru, W, TiN, TaN, WN, etc.). Other suitable materials are within the contemplated scope of disclosure. For example, each of the metal RDL layers 122a, 124a, 126a may include a layer stack of a TiN layer and a Cu layer.

Figure 1D:
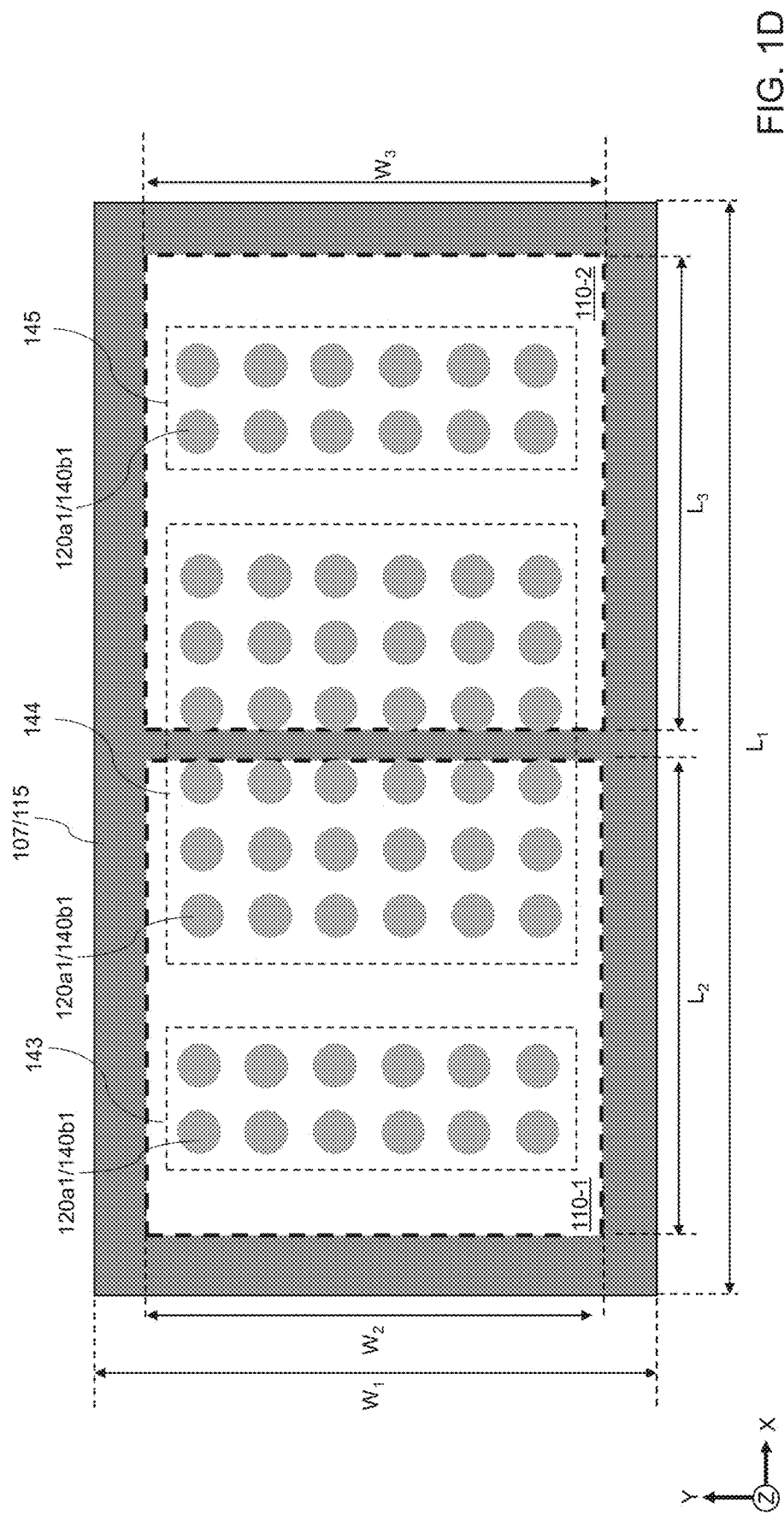
FIG. 1D is a plan view of the metal bonding pads (e.g., C4 pre-solder on the RDL structure upper bonding pads) of RDL structure in the package assembly, according to one or more embodiments.

FIG. 1D is a plan view of the metal bonding pads 120a1 (e.g., C4 pre-solder on the metal bonding pads 120a1) of RDL structure 120 in the package assembly 100, according to one or more embodiments. A placement of the metal bonding pads 120a1 may correspond to a placement of the metal bonding pads 140b1 on the first semiconductor device 143 (e.g., HBM die), second semiconductor device 144 (e.g., SOC die), and third semiconductor device 145 (e.g., HBM die). The metal bonding pads 140b1 may include, for example, I/O pads for inputting data to and outputting data from the first semiconductor device 143, second semiconductor device 144, and third semiconductor device 145. As illustrated in FIG. 1D, the second semiconductor device 144 may bridge the first substrate portion 110-1 and the second substrate portion 110-2. In this matter, the second semiconductor device 144 (e.g., SOC device) bridges a plurality of substrate portions (i.e., first substrate portion 110-1 and the second substrate portion 110-2). Further, the first substrate portion 110-1 and second substrate portion 110-2 may be surrounded in the X-direction and Y-direction by the molding material layer 107.

As illustrated in FIG. 1D, the metal bonding pads 140b1 may be arranged in an array of rows extending in the X-direction and columns extending in the Y-direction. The first semiconductor device 143 may be connected to the RDL structure 120 by two columns of metal bonding pads 120a1/140b1 (e.g., a 2×6 array of I/O pads). The second semiconductor device 144 may be connected to the RDL structure 120 by 6 columns of metal bonding pads 120a1/140b1 (e.g., a 6×6 array of I/O pads). The third semiconductor device 145 may be connected to the RDL structure 120 by two columns of metal bonding pads 120a1/140b1 (e.g., a 2×6 array of I/O pads). The metal bonding pads 140b1 may have a similar size, shape, number, periodicity, etc. in one or more of the first semiconductor device 143, second semiconductor device 144 and third semiconductor device 145. However, the metal bonding pads 140b1 may alternatively have a different size, shape, number, periodicity, etc. in one or more of the first semiconductor device 143, second semiconductor device 144 and third semiconductor device 145.

As also illustrated in FIG. 1D, the first substrate portion 110-1 may have a length $L_2$ and the second substrate portion 110-2 may have a length $L_3$. The package substrate 115 (which may be bounded in the X-direction and Y-direction by the molding material layer 107) may have a length $L_1$ that is greater than the length $L_2$ and greater than the length $L_3$. The first substrate portion 110-1 may have a width $W_2$ and the second substrate portion 110-2 may have a width $W_3$ (which may be the same as $W_2$). The package substrate 115 may have a width $W_1$ that is greater than the width $W_2$ and greater than the width $W_3$. Although it is not illustrated in FIG. 1D, an outer boundary of the RDL structure 120 may be substantially correspond to the outer boundary of the package substrate 115.

The length $L_1$ of the package substrate 115 may be greater than the width $W_1$ of the package substrate 115. The length $L_2$ of the first substrate portion 110-1 may be greater than the width $W_2$ of the first substrate portion 110-1. The length $L_3$ of the second substrate portion 110-2 may be greater than the width $W_3$ of the second substrate portion 110-2. The first substrate portion 110-1 and a second substrate portion 110-2 may be substantially aligned in a longitudinal direction (e.g., the X-direction in FIG. 1D).

Figure 1E:
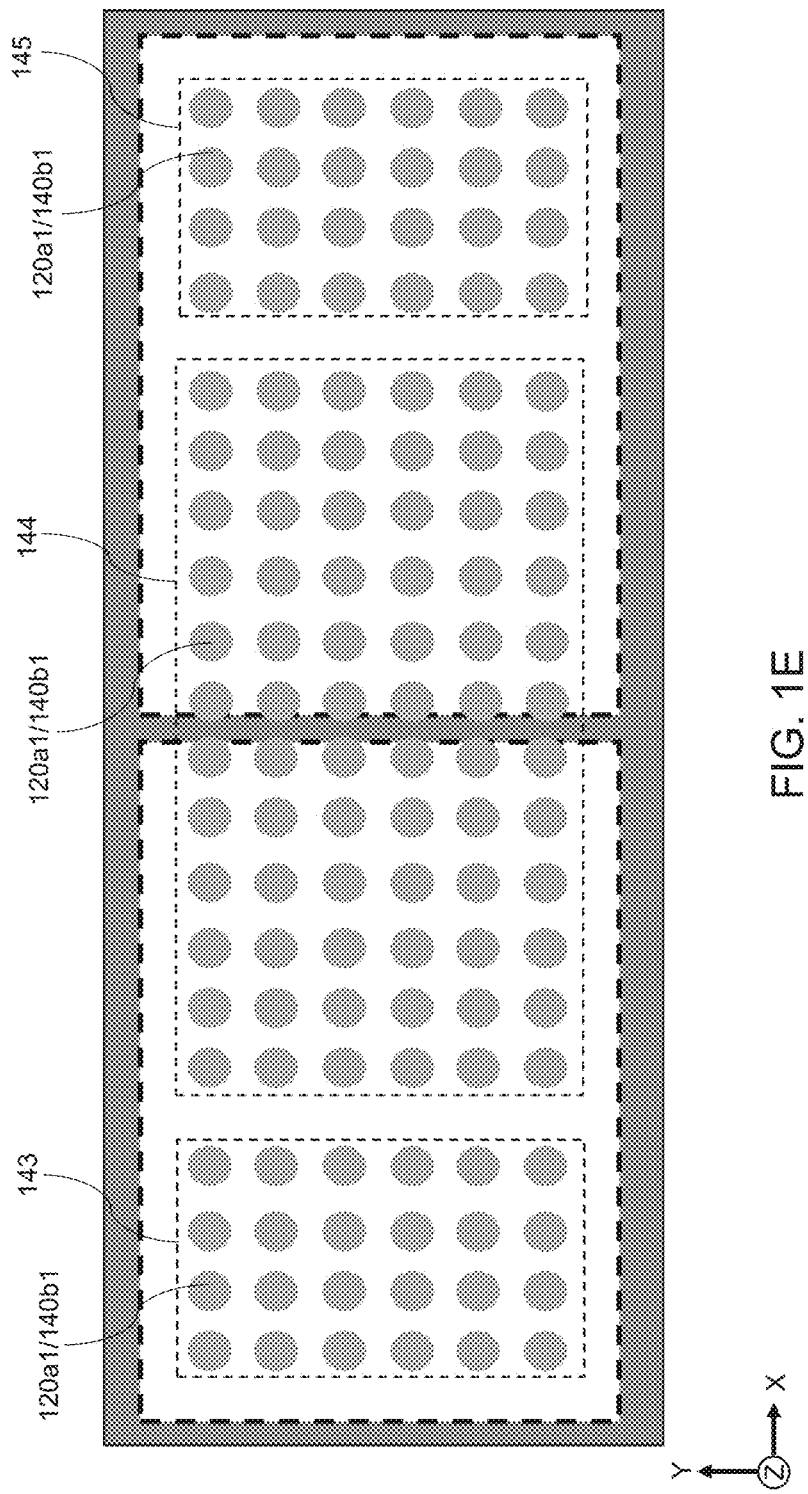
FIG. 1E is a plan view of an alternative layout the RDL structure upper bonding pads (and semiconductor device lower bonding pads) in the package assembly, according to one or more embodiments.

FIG. 1E is a plan view of an alternative layout the metal bonding pads 120a1 (and metal bonding pads 140b1) in the package assembly 100, according to one or more embodiments. In this alternative layout, the first semiconductor device 143 may be connected to the RDL structure 120 by four columns of metal bonding pads 120a1/140b1 (e.g., a 4×6 array of I/O pads). The second semiconductor device 144 may be connected to the RDL structure 120 by 12 columns of metal bonding pads 120a1/140b1 (e.g., a 12×6 array of I/O pads). The third semiconductor device 145 may be connected to the RDL structure 120 by four columns of metal bonding pads 120a1/140b1 (e.g., a 4×6 array of I/O pads).

FIGS. 2A-2J illustrate a method (e.g., an RDL first method) of making the package assembly 100, according to one or more embodiments.

Figure 2A:
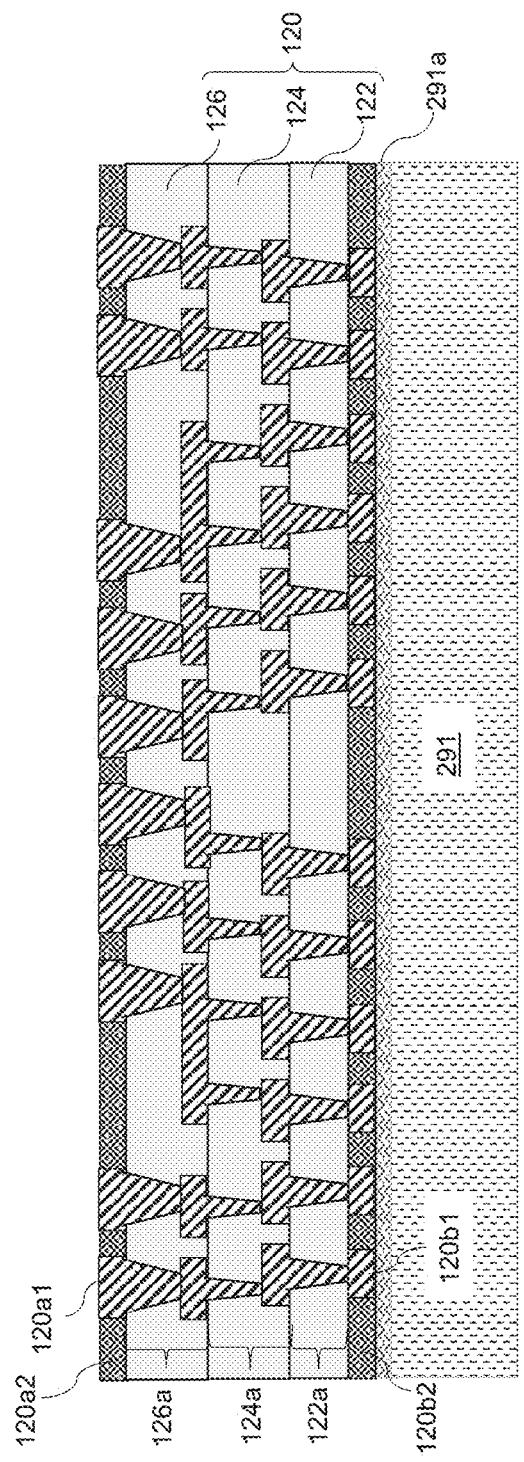
FIG. 2A is a vertical cross-sectional view of an intermediate structure in which the RDL structure may be formed on a first glass carrier, according to one or more embodiments.

FIG. 2A is a vertical cross-sectional view of an intermediate structure in which the RDL structure 120 may be formed on a first glass carrier 291, according to one or more embodiments. The first glass carrier 291 may include a layer of glass material having a thickness in a range of 600 μm to 1000 μm, although a thicker or thinner layer of glass material may be used. The first glass carrier 291 may include a rigid structure that supports the intermediate structure in subsequent processing.

An adhesive layer 291a may be applied to an upper surface of the first glass carrier 291. In this embodiment, the adhesive layer 291a may include a light-to-heat conversion (LTHC) layer. The LTHC layer is a solvent-based coating applied using a spin coating method. The LTHC layer may form a layer that converts ultraviolet light to heat such that the LTHC layer loses adhesion. For example, the LTHC layer may include Light-To-Heat Conversion Release Coating (LTHC) Ink™ that is commercially available from the 3M Company™. Alternatively, the adhesive layer 291a may include a thermally decomposing adhesive material. For example, the adhesive layer 291a may include an acrylic pressure-sensitive adhesive that decomposes at an elevated temperature. The debonding temperature of the thermally decomposing adhesive material may be in a range from 150° C. to 400° C. Other suitable thermally decomposing adhesive materials that decompose at other temperatures are within the contemplated scope of disclosure.

The plurality of metal bonding pads 120b1 may be formed on the adhesive layer 291a. To form the metal bonding pads 120b1, a layer of metal material (e.g., copper, aluminum or other suitable conductive materials) may be deposited (e.g., by CVD, PVD or other suitable deposition technique) on the adhesive layer 291a. The metal layer may be etched (e.g., by wet etching, dry etching, etc.) so as to form the metal bonding pads 120b1.

The protective layer 120b2 may be deposited (e.g., by CVD, PVD or other suitable deposition technique) on the adhesive layer 291a and around the metal bonding pads 120b1. The protective layer 120b2 may include, for example, a dielectric material such as polybenzoxazole (PBO), polyimide, benzocyclobutene (BCB), or other suitable dielectric material. The protective layer 120b2 may be etched (e.g., by wet etching, dry etching, etc.) so as to expose the surface of the metal bonding pads 120b1.

The first dielectric layer 122 may then be formed on the protective layer 120b2 and metal bonding pads 120b1. The first dielectric layer 122 may be formed, for example, by depositing a layer of dielectric polymer material such as polyimide (PI), benzocyclobutene (BCB), or polybenzobisoxazole (PBO). Other suitable materials are within the contemplated scope of disclosure. The first dielectric layer 122 may be formed, for example, by chemical vapor deposition (CVD), physical vapor deposition (PVD), spin coating, lamination or other suitable deposition technique. The first metal RDL layers 122a may then be formed in the first dielectric layer 122, for example, by an SAP process. The second dielectric layer 124 including the second metal RDL layers 124a may then be formed on the first dielectric layer 122. The third dielectric layer 126 including the third metal RDL layers 126a may then be formed on the second dielectric layer 124.

The metal bonding pads 120a1 may be formed, for example, as part of forming the third metal RDL layers 126a, or may be formed separately. The protective layer 120a2 may then be deposited (e.g., by CVD, PVD or other suitable deposition technique) on the third dielectric layer 126 and on the metal bonding pads 120a1. The protective layer 120a2 may then be etched (e.g., by wet etching, dry etching, etc.) so as to expose the surface of the metal bonding pads 120a1.

Figure 2B:
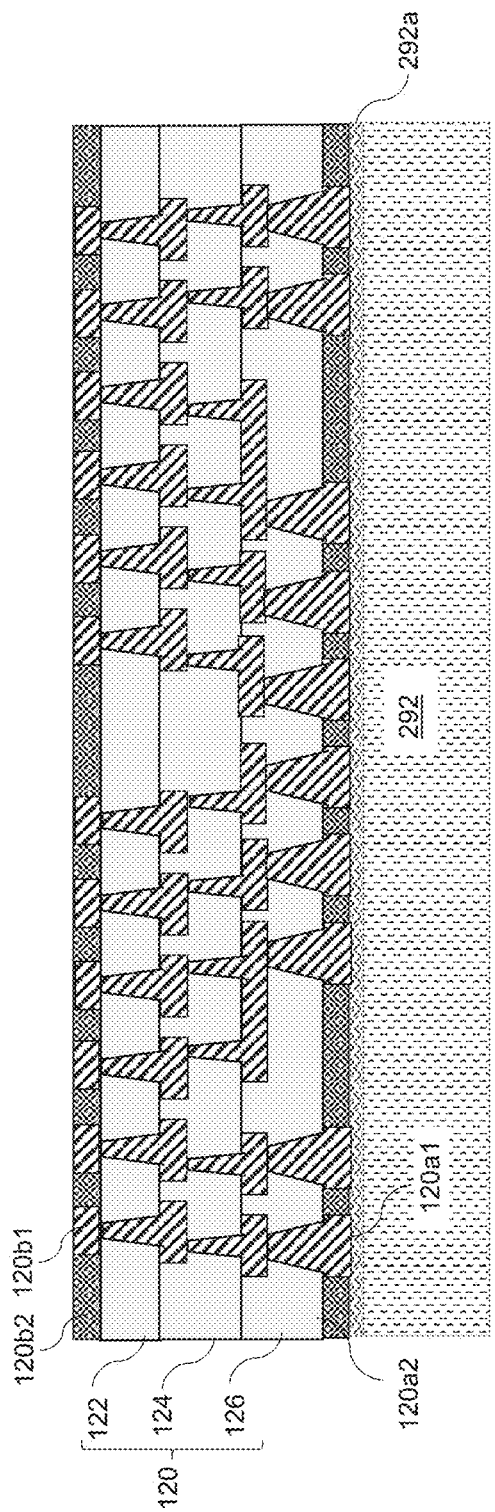
FIG. 2B is a vertical cross-sectional view of an intermediate structure including the RDL structure on a second glass carrier, according to one or more embodiments.

FIG. 2B is a vertical cross-sectional view of an intermediate structure including the RDL structure 120 on a second glass carrier 292, according to one or more embodiments. The intermediate structure in FIG. 2B may be attained by first bonding a second glass carrier 292 to the upper surface of the intermediate structure of FIG. 2A (i.e., the surface opposite the first glass carrier 291). In particular, an adhesive layer 292a (e.g., similar to adhesive layer 291a) may be formed on the protective layer 120a2 and the metal bonding pads 120a1. The second glass carrier 292 (e.g., similar to the first glass carrier 291) may then be bonded to the adhesive layer 292a.

The intermediate structure of FIG. 2A may then be inverted so that the RDL structure 120 is supported on the second glass carrier 292. The first glass carrier 291 may then be removed, for example, by decomposing the adhesive layer 291a by heat, UV light, etc. to attain the intermediate structure of FIG. 2B.

Figure 2C:
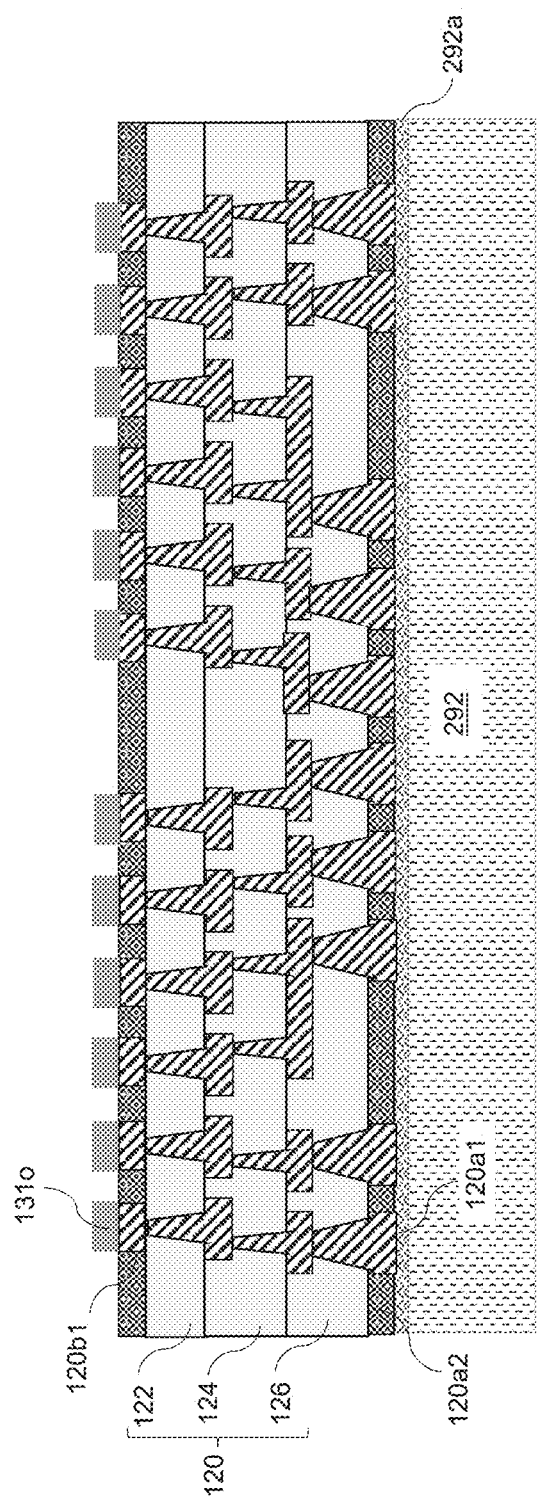
FIG. 2C is a vertical cross-sectional view of an intermediate structure including C4 pre-solder layers on the RDL structure, according to one or more embodiments.

FIG. 2C is a vertical cross-sectional view of an intermediate structure including C4 pre-solder layers 1310 on the RDL structure 120, according to one or more embodiments. The pre-solder layer 1310 may be composed, for example, of a solder material including one or more of tin, copper, silver, bismuth, indium, zinc, and antimony. In particular, the solder material may include a tin-silver-copper alloy including about 3-4% silver, 0.5-0.7% copper, and the balance (95%+) tin. The pre-solder layer 1310 may be formed on the metal bonding pads 120b1, for example, by a plating process or reflowing process.

Figure 2D:
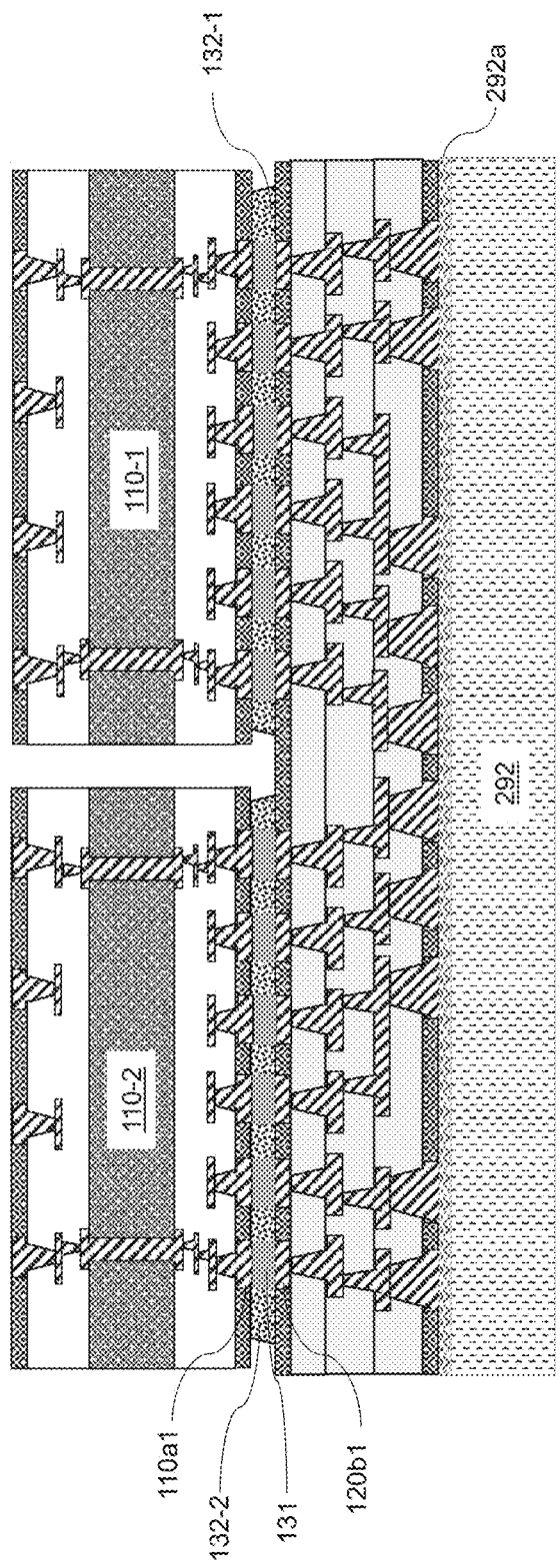
FIG. 2D is a vertical cross-sectional view of an intermediate structure including the first substrate portion and second substrate portion on the RDL structure, according to one or more embodiments.

FIG. 2D is a vertical cross-sectional view of an intermediate structure including the first substrate portion 110-1 and second substrate portion 110-2 on the RDL structure 120, according to one or more embodiments. The intermediate structure may be achieved by forming a solder layer (not shown) on the metal bonding pads 110a1 on the first substrate portion 110-1 and second substrate portion 110-2.

One or more layers of underbump metallization (UBM) may be formed on the metal bonding pads 110a1 prior to the forming of the solder layer. The solder layer may be composed, for example, of a solder material including one or more of tin, copper, silver, bismuth, indium, zinc, and antimony. In particular, the solder material may include a tin-silver-copper alloy including about 3-4% silver, 0.5-0.7% copper, and the balance (95%+) tin. The solder layer may be formed by a plating process or a reflowing process.

The first substrate portion 110-1 and second substrate portion 110-2 may be inverted and positioned over the RDL structure 120. The metal bonding pads 110a1 (with the solder layer thereon) may be aligned with the metal bonding pads 120b1 (with the pre-solder layer 1310 thereon). The first substrate portion 110-1 and second substrate portion 110-2 may be lowered onto the RDL structure 120 so that that solder layer on the metal bonding pads 110a1 may contact the pre-solder layer 1310 on the metal bonding pads 120b1. A reflow process may be performed in which the intermediate structure is heated to a reflow temperature of the pre-solder layer 1310 and solder layer (e.g., about 220° C. to 260° C.). This may cause the pre-solder layer 1310 and solder layer to melt and combine to form a solder joint of the bump structures 131. The intermediate structure may be allowed to cool so that that the bump structures 131 may constitute a solid interconnection between the first substrate portion 110-1 and the RDL structure 120, and between the second substrate portion 110-2 and the RDL structure 120.

The first package underfill layer 132-1 and second package underfill layer 132-2 may be formed by injecting an underfill material (e.g., epoxy-based polymeric material) around the bump structures 131 (e.g., array of bump structures 131). Any known underfill material application method may be used, which may be, for example, the capillary underfill method, the molded underfill method, or the printed underfill method. The first package underfill layer 132-1 may be formed underneath the first substrate portion 110-1. The second package underfill layer 132-2 may be formed (e.g., separately from the first package underfill layer 132-1) underneath the second substrate portion 110-2, respectively.

Figure 2E:
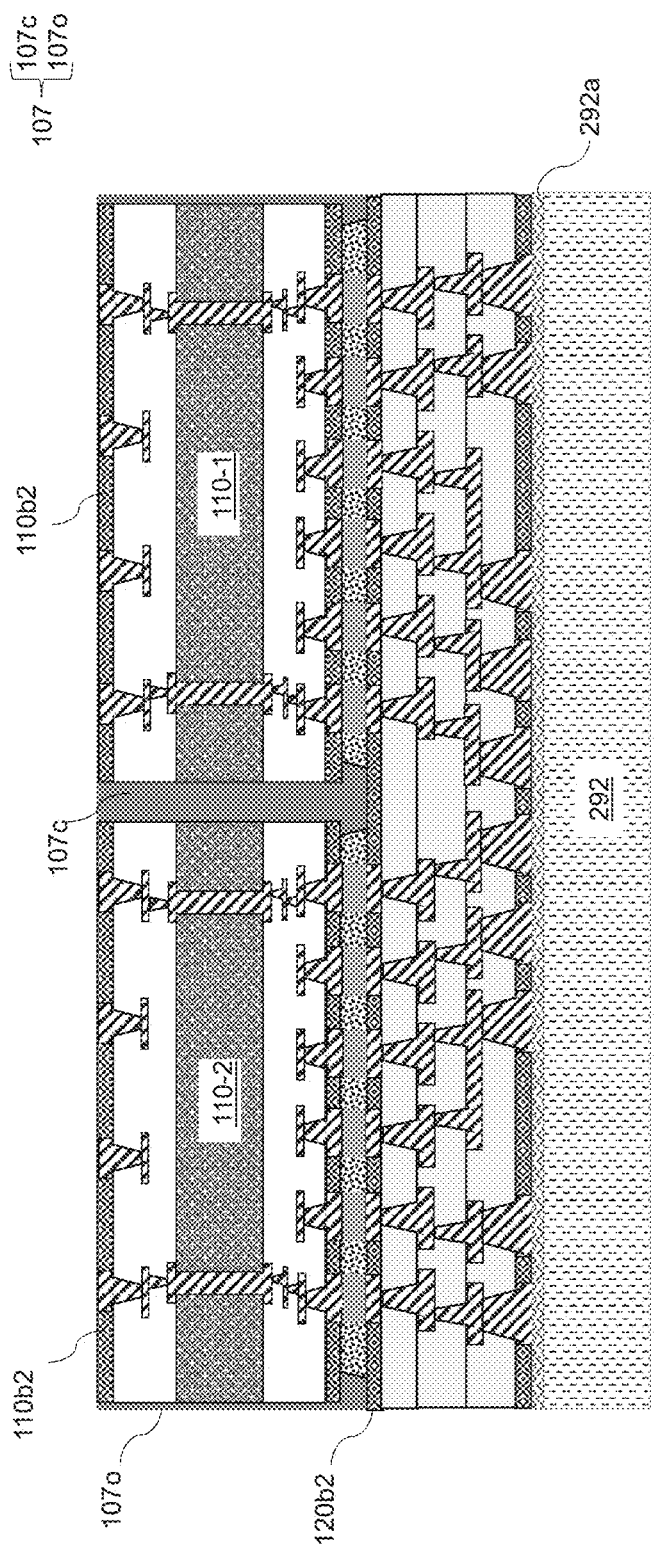
FIG. 2E is a vertical cross-sectional view of an intermediate structure including the molding material layer on the first substrate portion and second substrate portion, according to one or more embodiments.

FIG. 2E is a vertical cross-sectional view of an intermediate structure including the molding material layer 107 on the first substrate portion 110-1 and second substrate portion 110-2, according to one or more embodiments. The molding material layer 107 (e.g., epoxy molding compound (EMC)) may be formed on the first substrate portion 110-1 and second substrate portion 110-2 so as to form an EMC die frame. The molding material layer 107 may be applied between the first substrate portion 110-1 and second substrate portion 110-2 so as to form the central molding material layer portion 107c. The molding material layer 107 may also be applied around an outer perimeter of the first substrate portion 110-1 and second substrate portion 110-2 so as to form the outer molding material layer portion 107o.

The molding material layer 107 may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC may provide better handling, good flowability, less voids, better fill, and less flow marks. Solid EMC may provide less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability.

The molding material layer 107 (e.g., EMC) may be cured at a curing temperature (e.g., in a range from 125° C. to 150° C.) to form an EMC die frame that may laterally enclose the first substrate portion 110-1 and second substrate portion 110-2. Excess portions of the molding material layer 107 may be removed from above the horizontal plane including the bottom surface (e.g., a surface of the protective layer 110b2) of the first substrate portion 110-1 and second substrate portion 110-2 by a planarization process such as chemical mechanical planarization (CMP).

Figure 2F:
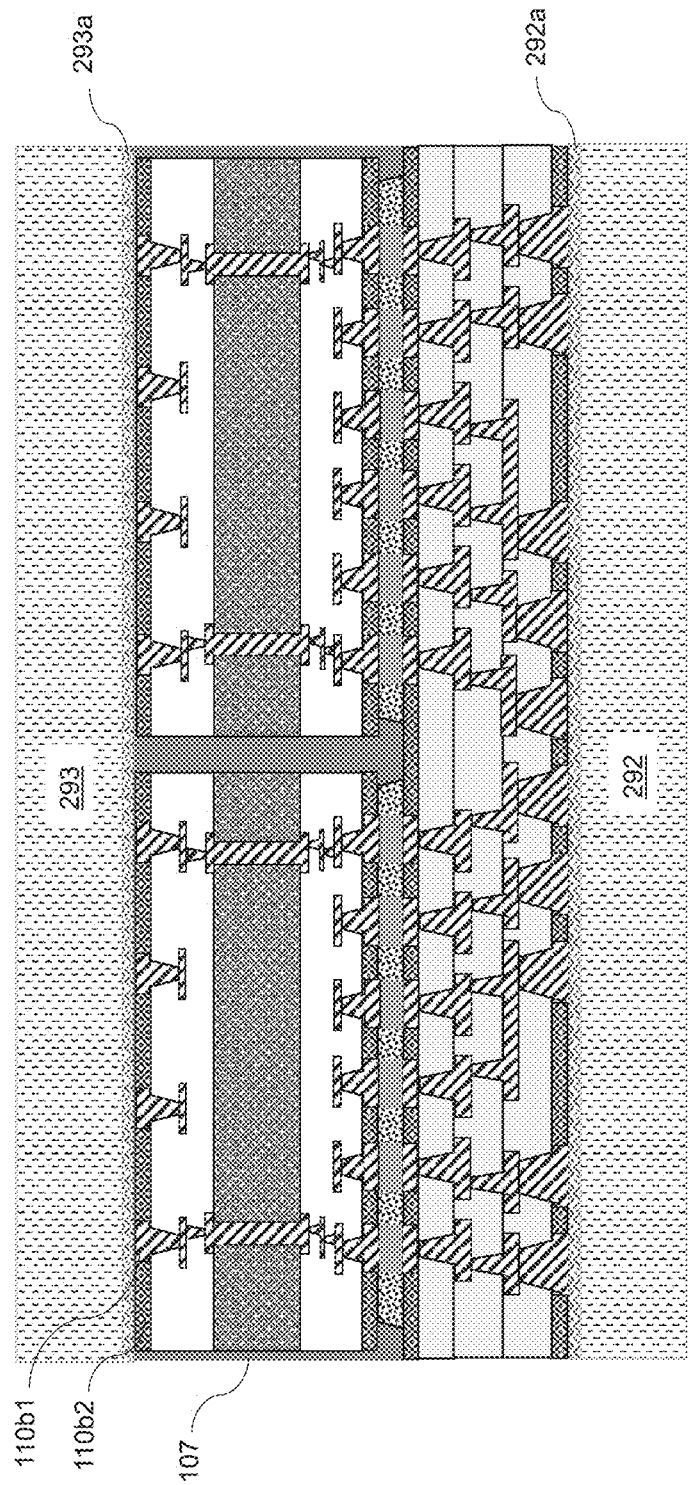
FIG. 2F is a vertical cross-sectional view of an intermediate structure including a third glass carrier, according to one or more embodiments.

FIG. 2F is a vertical cross-sectional view of an intermediate structure including a third glass carrier 293, according to one or more embodiments. An adhesive layer 293a (e.g., similar to adhesive layer 291a) may be formed on the protective layer 110b2 and the metal bonding pads 110b1. The adhesive layer 293a may also be formed on a surface (e.g., bottom surface) of the molding material layer 107. The third glass carrier 293 (e.g., similar to the first glass carrier 291) may then be bonded to the adhesive layer 293a.

Figure 2G:
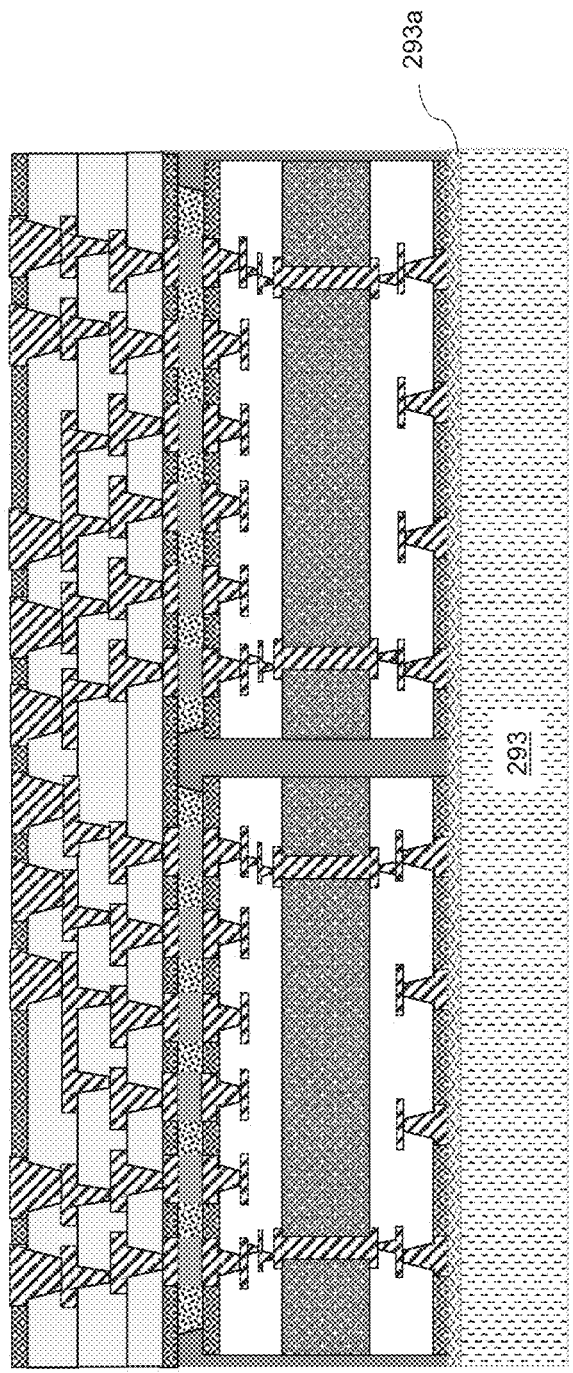
FIG. 2G is a vertical cross-sectional view of an intermediate structure after removal of the second glass carrier, according to one or more embodiments.

FIG. 2G is a vertical cross-sectional view of an intermediate structure after removal of the second glass carrier 292, according to one or more embodiments. The intermediate structure may be attained by first inverting the intermediate structure of FIG. 2F. The second glass carrier 292 may then be removed, for example, by decomposing the adhesive layer 292a by heat, UV light, etc. to achieve the intermediate structure of FIG. 2G.

Figure 2H:
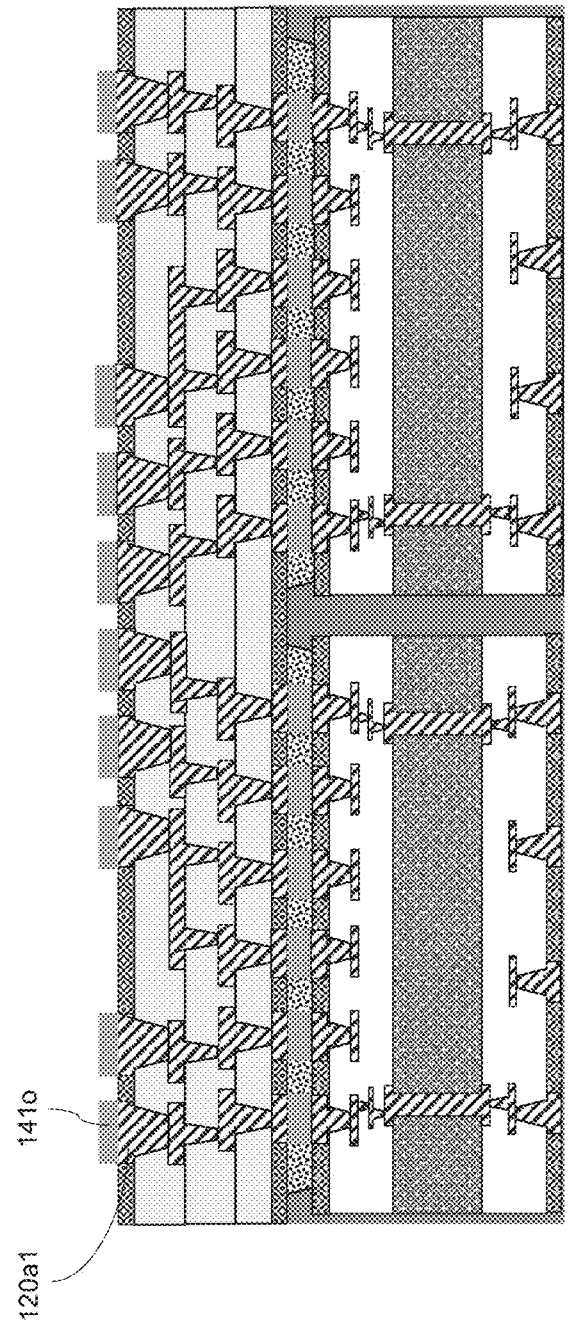
FIG. 2H is a vertical cross-sectional view of an intermediate structure after forming the pre-solder layers (e.g., C4 pre-solder layers) and removal of the third glass carrier 293, according to one or more embodiments.

FIG. 2H is a vertical cross-sectional view of an intermediate structure after forming the pre-solder layers 1410 (e.g., C4 pre-solder layers) and removal of the third glass carrier 293, according to one or more embodiments. The pre-solder layers 1410 may be composed, for example, of the same solder material as the pre-solder layers 131o. The pre-solder layer 1410 may be formed on the metal bonding pads 120a1, for example, by a plating process or reflowing process. The third glass carrier 293 may then be removed, for example, by decomposing the adhesive layer 293a by heat, UV light, etc. to achieve the intermediate structure of FIG. 2H.

Figure 2I:
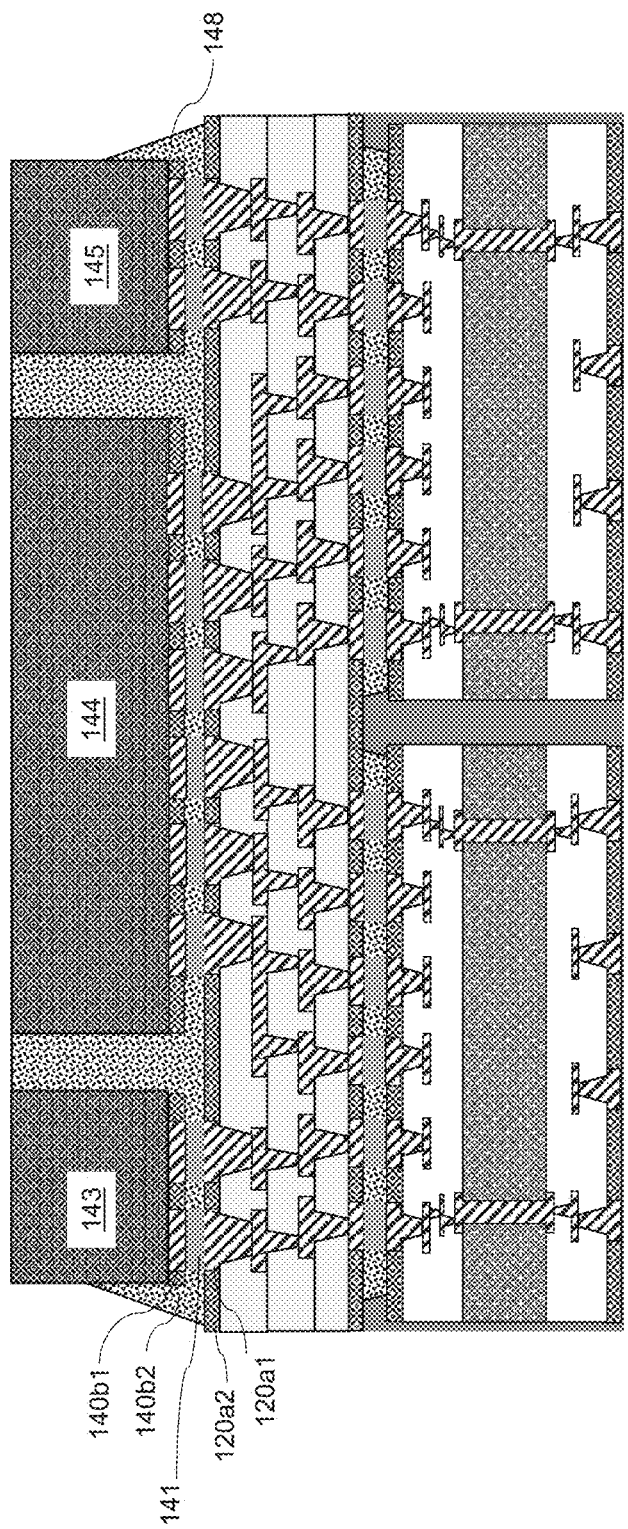
FIG. 2I is a vertical cross-sectional view of an intermediate structure after the mounting of the first semiconductor device, second semiconductor device and third semiconductor device, according to one or more embodiments.

FIG. 2I is a vertical cross-sectional view of an intermediate structure after the mounting of the first semiconductor device 143, second semiconductor device 144 and third semiconductor device 145, according to one or more embodiments. The first semiconductor device 143, second semiconductor device 144 and third semiconductor device 145 may be mounted on the RDL structure 120, for example, by flip chip bonding in a pick and place (PNP) process.

The intermediate structure may be achieved by first forming a solder layer (not shown) on the metal bonding pads 140b1 on each of the first semiconductor device 143, second semiconductor device 144 and third semiconductor device 145. One or more layers of underbump metallization (UBM) may be formed on the metal bonding pads 140b1 prior to the forming of the solder layer. The solder layer may be composed, for example, of a solder material including one or more of tin, copper, silver, bismuth, indium, zinc, and antimony. In particular, the solder material may include a tin-silver-copper alloy including about 3-4% silver, 0.5-0.7% copper, and the balance (95%+) tin. The solder layer may be formed by a plating process or a reflowing process.

The first semiconductor device 143, second semiconductor device 144 and third semiconductor device 145 may then be positioned over the RDL structure 120. The metal bonding pads 140b1 (with the solder layer thereon) may then be aligned with the metal bonding pads 120a1 (with the pre-solder layer 1410 thereon). The first semiconductor device 143, second semiconductor device 144 and third semiconductor device 145 may then be lowered onto the RDL structure 120 so that that solder layer on the metal bonding pads 140b1 may contact the pre-solder layer 1410 on the metal bonding pads 120a1. A reflow process may be performed in which the intermediate structure is heated to a reflow temperature of the pre-solder layer 1410 and solder layer (e.g., about 220° C. to 260° C.). This may cause the pre-solder layer 1410 and solder layer to melt and combine to form solder joint of the bump structures 141 (e.g., micro-bump structures). The intermediate structure may then be allowed to cool so that that the bump structures 141 may constitute a solid interconnection between the first semiconductor device 143 and the RDL structure 120, between the second semiconductor device 144 and the RDL structure 120, and between the third semiconductor device 145 and the RDL structure 120.

The interposer underfill layer 148 may be formed by injecting an underfill material (e.g., epoxy-based polymeric material) around the bump structures 141 (e.g., array of bump structures 141). Any known underfill material application method may be used, which may include, for example, the capillary underfill method, the molded underfill method, or the printed underfill method. The interposer underfill layer 148 may be formed under and around the first, second and third semiconductor devices 143, 144, 145 and on an upper surface of the RDL structure 120. The interposer underfill layer 148 may be formed around the bump structures 141 so as to fix the first, second and third semiconductor devices 143, 144, 145 to the RDL structure 120.

Figure 2J:
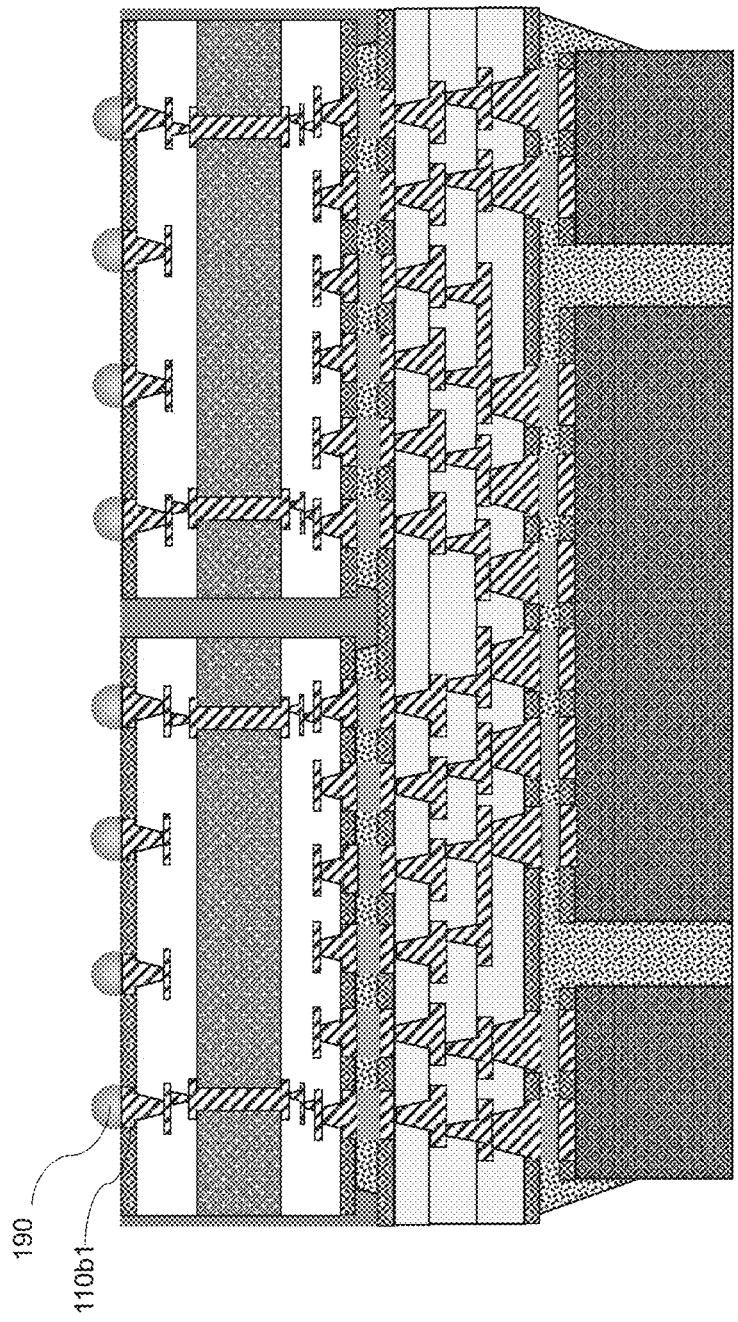
FIG. 2J is a vertical cross-sectional view of the package assembly after the forming a plurality of solder balls on the package substrate, according to one or more embodiments.

FIG. 2J is a vertical cross-sectional view of the package assembly 100 after the forming a plurality of solder balls 190 on the package substrate 115, according to one or more embodiments. To complete the package assembly 100, the intermediate structure of FIG. 2I may be inverted and the plurality of solder balls 190 may be formed on the metal bonding pads 110b1. The plurality of solder balls 190 may be composed, for example, of the same or similar solder materials as the pre-solder layers 131o, 141o. The plurality of solder balls 110b may constitute a ball-grid array (BGA) that may allow the package assembly 100 to be securely mounted (e.g., by surface mount technology (SMT)) on a substrate such as a PCB and electrically coupled to the substrate. The plurality of solder balls 190 may be formed, for example, for example, by an automated process such as in computer-controlled automatic reflow ovens.

Figure 3:
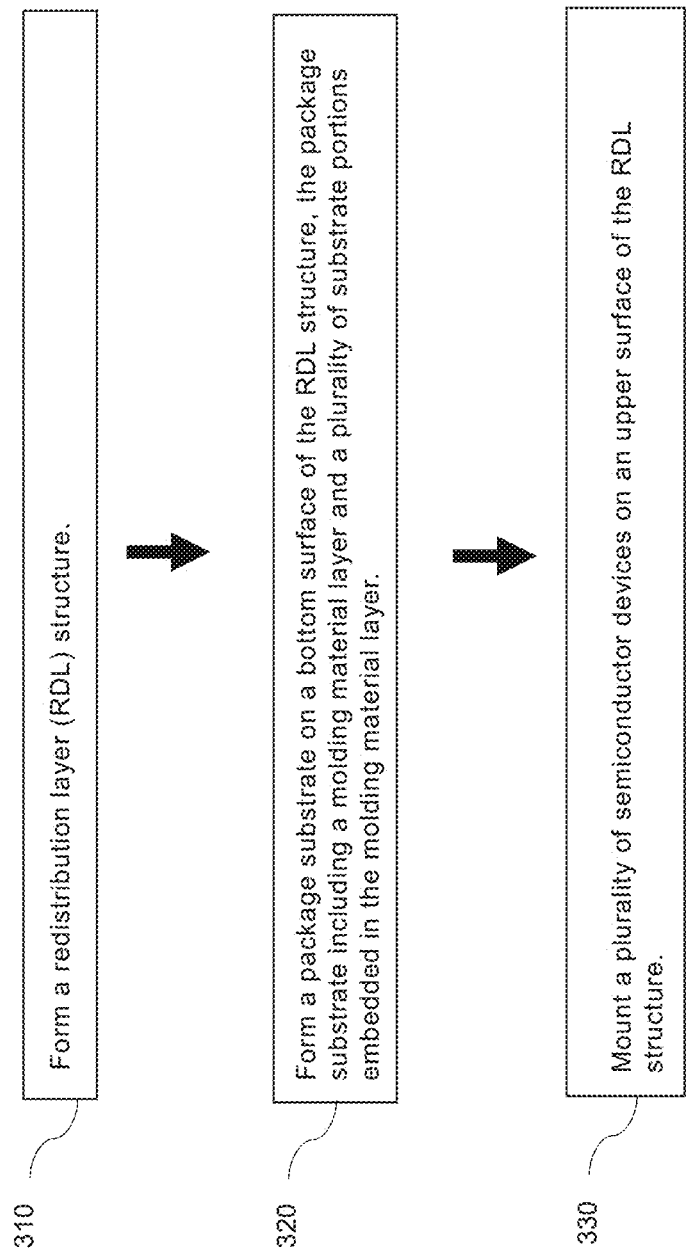
FIG. 3 is a flow chart illustrating a method (e.g., RDL first method) of making the package assembly, according to one or more embodiments.

FIG. 3 is a flow chart illustrating a method (e.g., RDL first method) of making the package assembly 100, according to one or more embodiments. Step 310 may include forming a redistribution layer (RDL) structure. Step 320 may include forming a package substrate on a bottom surface of the RDL structure, the package substrate including a molding material layer and a plurality of substrate portions embedded in the molding material layer. Step 330 may include mounting a plurality of semiconductor devices on an upper surface of the RDL structure.

Figure 4A:
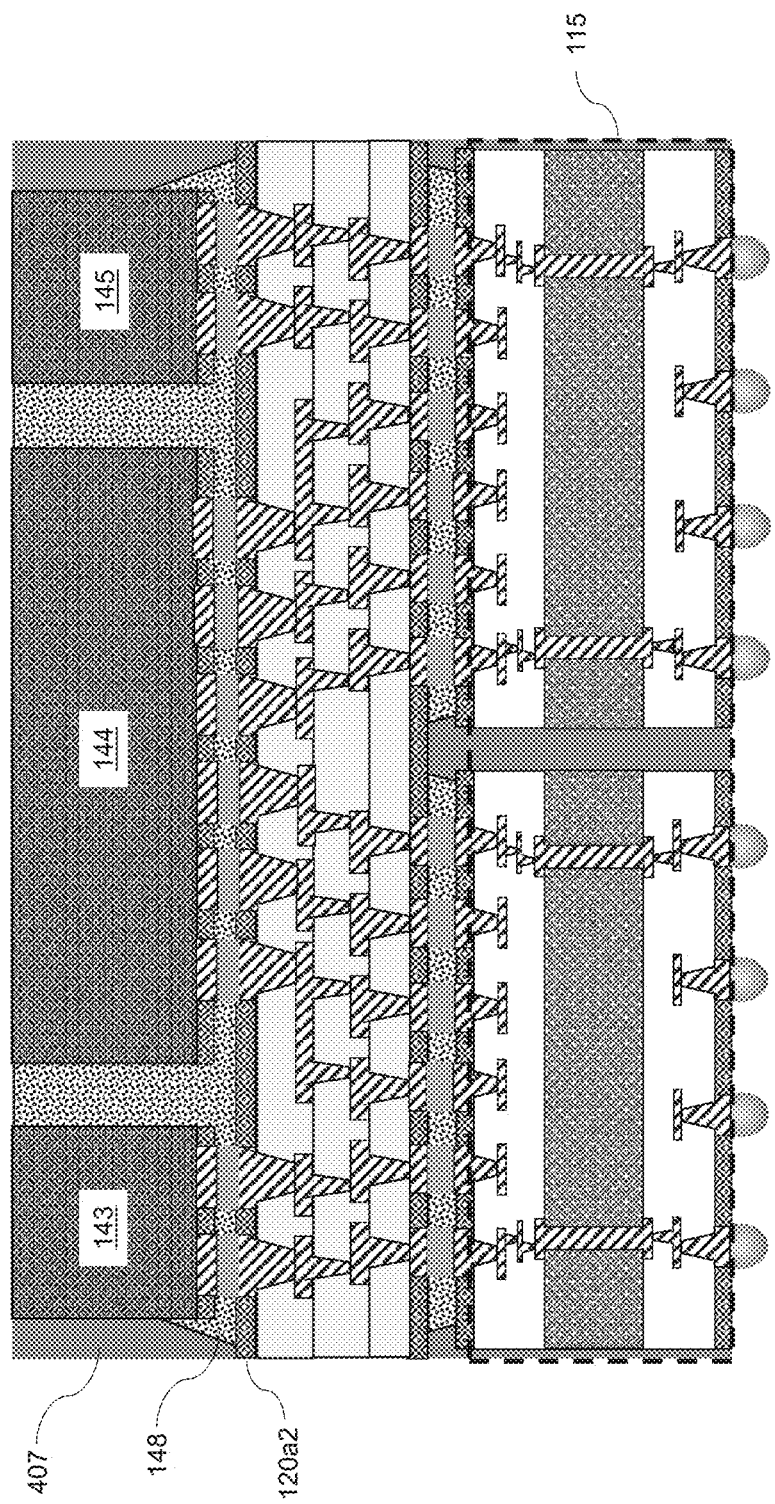
FIG. 4A is a vertical cross-sectional view of a first alternative design of the package assembly, according to one or more embodiments.

FIG. 4A is a first alternative design of the package assembly 100, according to one or more embodiments. The first alternative design may be substantially similar to the design of the package assembly 100 in FIG. 1A. However, in addition to the design in FIG. 1A, the first alternative design may include a molding material layer 407 (e.g., EMC) formed on the first semiconductor device 143, second semiconductor device 144, and third semiconductor device 145. As with the molding material layer 107, the molding material layer 407 may include an epoxy-containing compound that may be hardened (i.e., cured) to provide a dielectric material portion having sufficient stiffness and mechanical strength. The EMC may include epoxy resin, hardener, silica (as a filler material), and other additives.

The first alternative design may be formed by a method similar to that described above in FIGS. 2A-2J. The molding material layer 407 may be formed, for example, after the mounting of the first semiconductor device 143, second semiconductor device 144 and third semiconductor device (e.g., FIG. 2I), and before the forming of the solder balls 190 (e.g., FIG. 2J). As illustrated in FIG. 4A, the molding material layer 407 may also be formed on the interposer underfill layer 148 and the protective layer 120a2. The molding material layer 407 may be applied around an outer perimeter of the first semiconductor device 143, second semiconductor device 144 and third semiconductor device 145, so as to form an EMC die frame. The molding material layer 407 (e.g., EMC) may be cured at a curing temperature (e.g., in a range from 125° C. to 150° C.) to form an EMC die frame that may laterally enclose the first semiconductor device 143, second semiconductor device 144 and third semiconductor device 145. Excess portions of the molding material layer 407 may then be removed from above the horizontal plane including the upper surface of the first semiconductor device 143, second semiconductor device 144 and third semiconductor device 145 and the interposer underfill layer 148, by a planarization process such as chemical mechanical planarization (CMP).

Figure 4B:
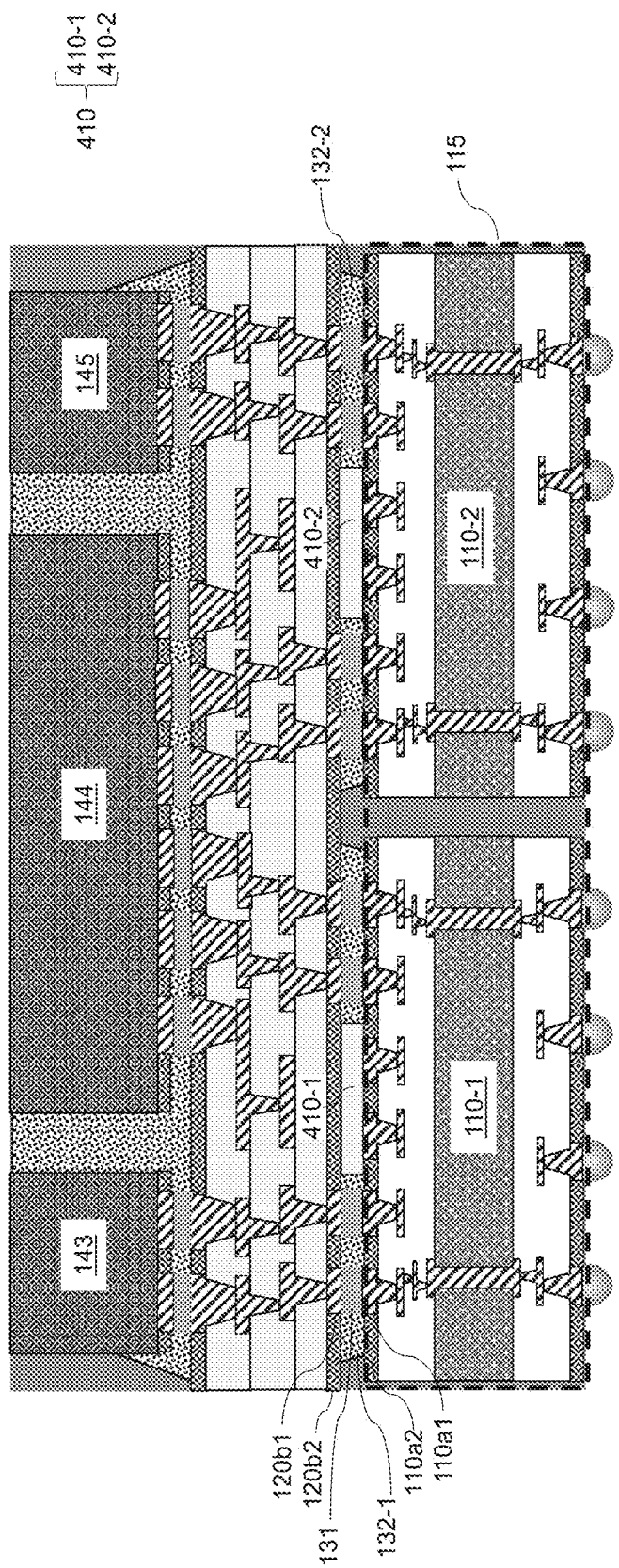
FIG. 4B is a vertical cross-sectional view of a second alternative design of the package assembly, according to one or more embodiments.

FIG. 4B is a second alternative design of the package assembly 100, according to one or more embodiments. The second alternative design may be substantially similar to the first alternative design of the package assembly 100 in FIG. 4A. However, in addition to the first alternative design in FIG. 4A, the second alternative design may include one or more integrated passive devices 410 (IPDs) such as baluns, filters, couplers, and diplexers that are used in portable, wireless and RF applications. The IPDs 410 may include a first IPD 410-1 between the RDL structure 120 and the first substrate portion 110-1. The first IPD 410-1 may be formed in the first package underfill layer 132-1. The IPDs 410 may also include a second IPD 410-2 between the RDL structure 120 and the second substrate portion 110-2. The second IPD 410-2 may be formed in the second package underfill layer 132-2.

The first IPD 410-1 and second IPD 410-2 may have a similar or different structure, function and location in the package assembly 100. In one or more embodiments, a bottom surface of the first IPD 410-1 and second IPD 410-2 may contact one or more of the metal bonding pads 110a1 and the protective layer 110a2. An upper surface of the first IPD 410-1 and the second IPD 410-2 may contact the protective layer 120b2. Although it is not illustrated in FIG. 4B, the upper surface of the first IPD 410-1 and second IPD 410-2 may also contact one or more metal bonding pads 120b1.

The second alternative design of the package assembly 100 in FIG. 4B may be made by a method similar to the method described above with respect to FIGS. 2A-2J. However, referring to FIG. 2B, with the second alternative design, the first IPD 410-1 and second IPD 410-2 may be mounted on the metal bonding pads 120b1 and protective layer 120b2, before forming the pre-solder layer 1310 in FIG. 2C. The first substrate portion 110-1 and second substrate portion 110-2 may then be mounted on the RDL structure 120 with the first IPD 410-1 and second IPD 410-2 therebetween (e.g., see FIG. 2D). The first package underfill layer 132-1 may then be formed around the first IPD 410-1 and the second package underfill layer 132-2 may be formed around the second IPD 410-2 (e.g., see FIG. 2D). The method may then proceed as described above with respect to FIGS. 2E-2J.

Figure 5:
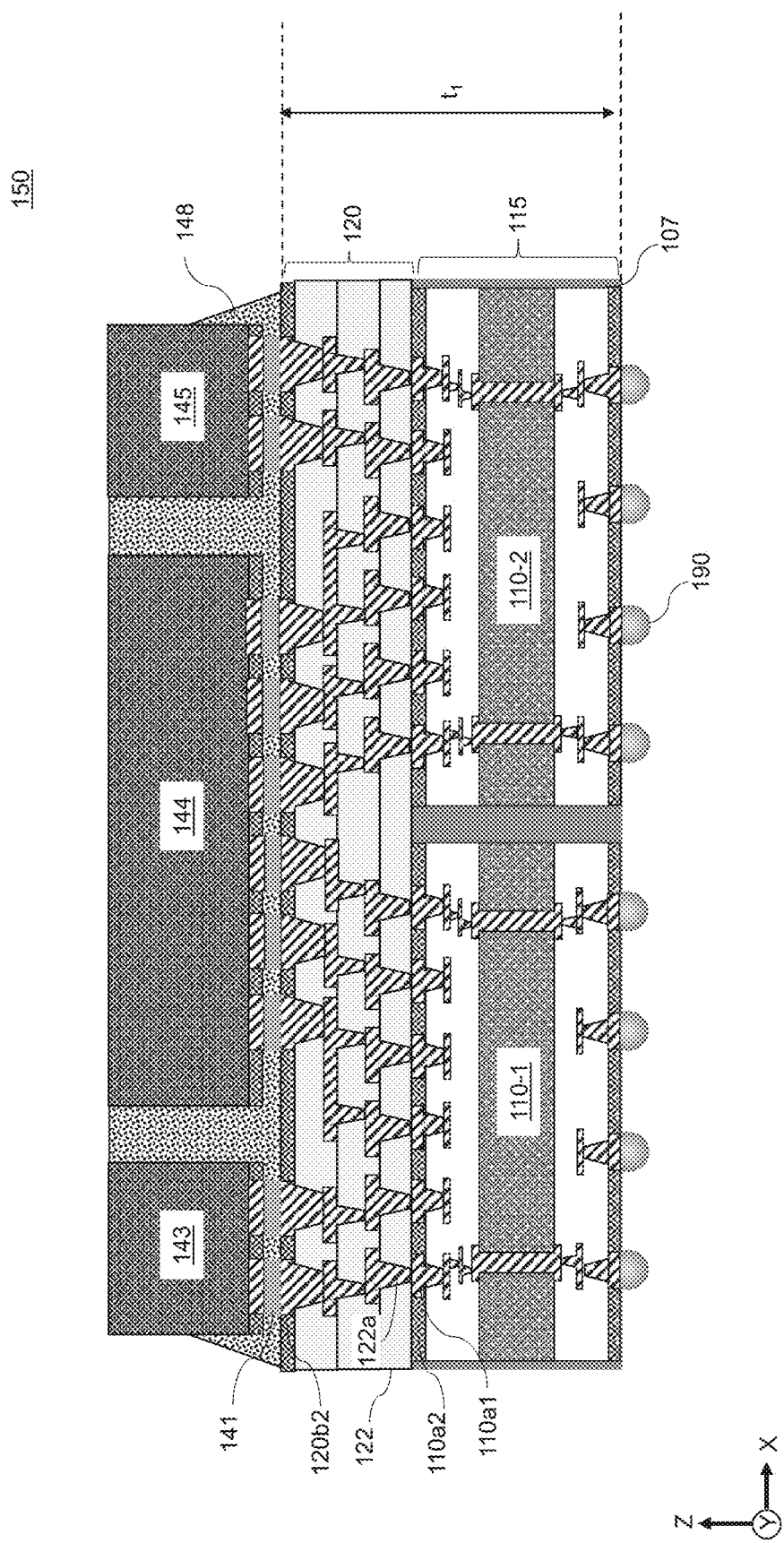
FIG. 5 is a vertical cross-sectional view of a package assembly, according to one or more embodiments.

FIG. 5 is a vertical cross-sectional view of a package assembly 150, according to one or more embodiments. The package assembly 150 may be formed, for example, by a substrate-attach first method.

The package assembly 150 may have a structure and function that is substantially the same as the package assembly 100 illustrated in FIG. 1A. Unless otherwise stated below, the features and functions of the package assembly 100 described above may be included in the package assembly 150.

The package assembly 150 may include the package substrate 115 that includes the first substrate portion 110-1, second substrate portion 110-2 embedded in the molding material layer 107. The package assembly 150 may include the RDL structure 120 on the package substrate 115. The package assembly 150 may include the first semiconductor device 143, second semiconductor device 144 and third semiconductor device 145 mounted on the RDL structure 120. The package assembly 150 may include the bump structures 141 that connect the first semiconductor device 143, second semiconductor device 144 and third semiconductor device 145 to the metal bonding pads 120b1. The package assembly 150 may include the interposer underfill layer 148 formed around the bump structures 141, and under and around the first semiconductor device 143, second semiconductor device 144 and third semiconductor device 145. The package assembly 150 may also include the solder balls 190 that may constitute a BGA on a bottom surface of the package substrate 115.

However, the package assembly 150 may differ from the package assembly 100 in that the package assembly 150 may omit the metal bonding pads 120b1, protective layer 120b2, bump structures 131, package underfill layer 132-1 and package underfill layer 132-2. That is, in the package assembly 150, the RDL structure 120 may contact (e.g., directly contact) the package substrate 115 (e.g., the first substrate portion 110-1 and second substrate portion 110-2). In particular, the first dielectric layer 122 of the RDL structure may contact (e.g., directly contact) the protective layer 110a2 and the metal bonding pads 110a1 of the package substrate 115. In one or more embodiments, the first metal RDL layers 122a in the first dielectric layer 122 of the RDL structure 120, may contact the metal bonding pads 110a1 of the package substrate 115. Further, because the RDL structure 120 may directly contact the package substrate 115 and omit the various features described above (e.g., metal bonding pads 120b1, protective layer 120b2, bump structures 131, package underfill layer 132-1 and package underfill layer 132-2), the thickness t1 of the combined package substrate 115 and RDL structure 120 in the package assembly 150 may be less than the thickness t1 in the package assembly 100.

FIGS. 6A-6G illustrate a method (e.g., a substrate-attach first method) of making the package assembly 150, according to one or more embodiments.

Figure 6A:
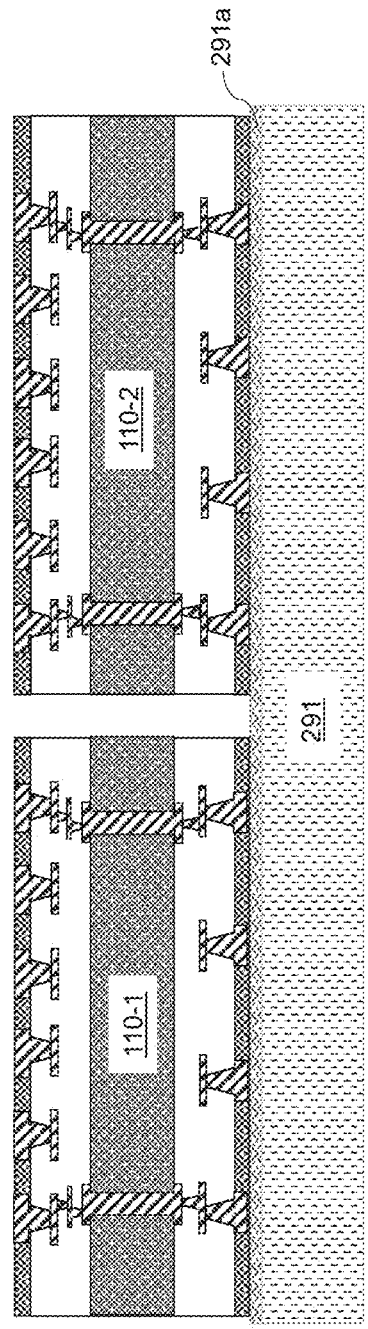
FIG. 6A is a vertical cross-sectional view of an intermediate structure in which the first substrate portion and the second substrate portion may be mounted on the first glass carrier, according to one or more embodiments.

FIG. 6A is a vertical cross-sectional view of an intermediate structure in which the first substrate portion 110-1 and the second substrate portion 110-2 may be mounted on the first glass carrier 291, according to one or more embodiments. The intermediate structure may be attained by first applying the adhesive layer 291a to an upper surface of the first glass carrier 291. The first substrate portion 110-1 and the second substrate portion 110-2 may be placed on the adhesive layer 291a, such as by an automated pick and place (PNP) process.

Figure 6B:
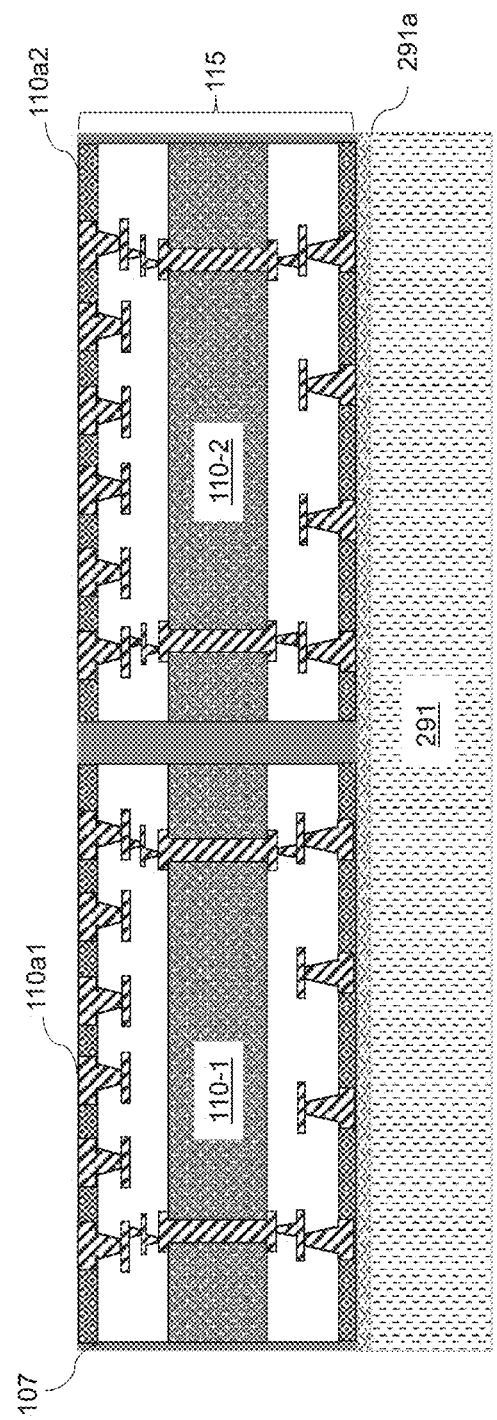
FIG. 6B is a vertical cross-sectional view of an intermediate structure including the molding material layer on the first substrate portion and second substrate portion, according to one or more embodiments.

FIG. 6B is a vertical cross-sectional view of an intermediate structure including the molding material layer 107 on the first substrate portion 110-1 and second substrate portion 110-2, according to one or more embodiments. The molding material layer 107 (e.g., epoxy molding compound (EMC)) may be between the first substrate portion 110-1 and second substrate portion 110-2, and around the outer perimeter of the first substrate portion 110-1 and second substrate portion 110-2. The molding material layer 107 (e.g., EMC) may be cured to form an EMC die frame that may laterally enclose the first substrate portion 110-1 and second substrate portion 110-2. Excess portions of the molding material layer 107 may be removed from above the horizontal plane including the upper surface (e.g., a surface of the protective layer 110a2) of the first substrate portion 110-1 and second substrate portion 110-2 by a planarization process such as chemical mechanical planarization (CMP).

Figure 6C:
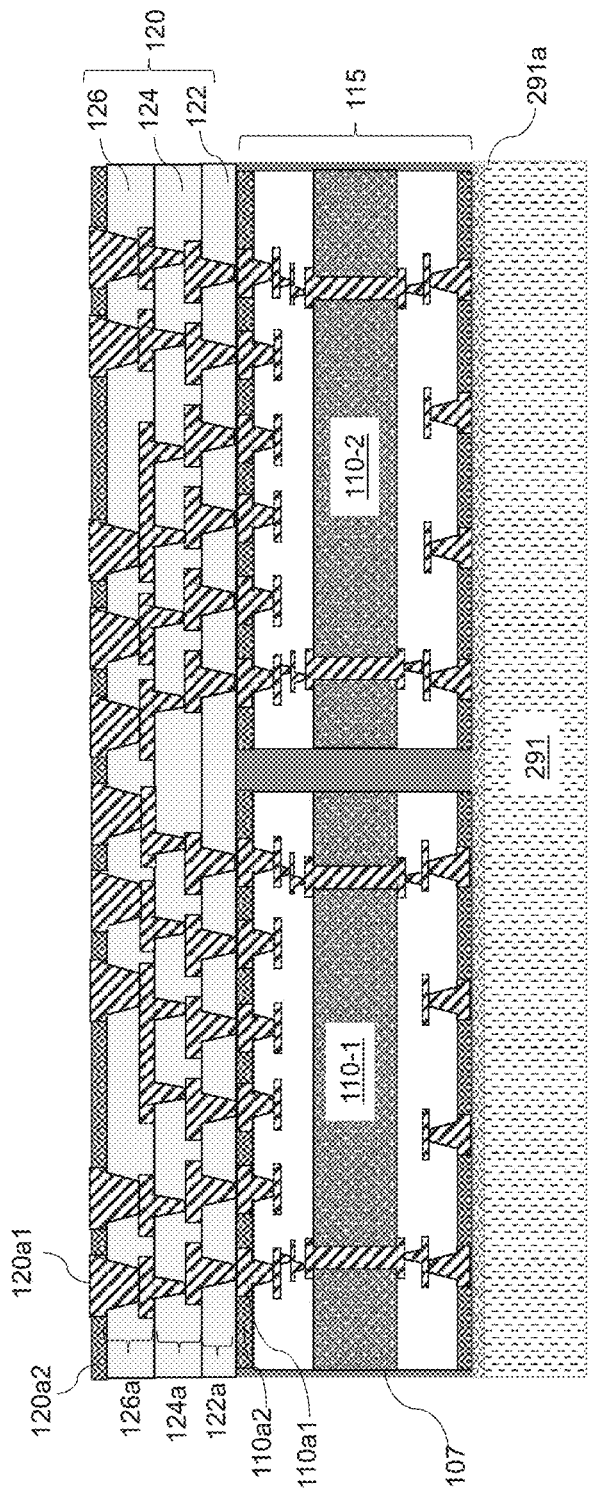
FIG. 6C is a vertical cross-sectional view of an intermediate structure including the RDL structure on package substrate, according to one or more embodiments.

FIG. 6C is a vertical cross-sectional view of an intermediate structure including the RDL structure 120 on package substrate 115, according to one or more embodiments. The intermediate structure may be attained by first forming the first dielectric layer 122 on (e.g., directly on) the package substrate 115. In particular, the first dielectric layer 122 may be formed on the protective layer 110a2, metal bonding pads 110a1, and the molding material layer 107. The first metal RDL layers 122a may then be formed in the first dielectric layer 122, for example, by an SAP process. The first metal RDL layers 122a may be formed so as to contact the metal bonding pads 110a1. The second dielectric layer 124 including the second metal RDL layers 124a, and the third dielectric layer 126 including the third metal RDL layers 126a may then be formed. The metal bonding pads 120a1 may be formed so as to contact the third metal RDL layers 126a, and the protective layer 120a2 may then be deposited on the third dielectric layer 126.

Figure 6D:
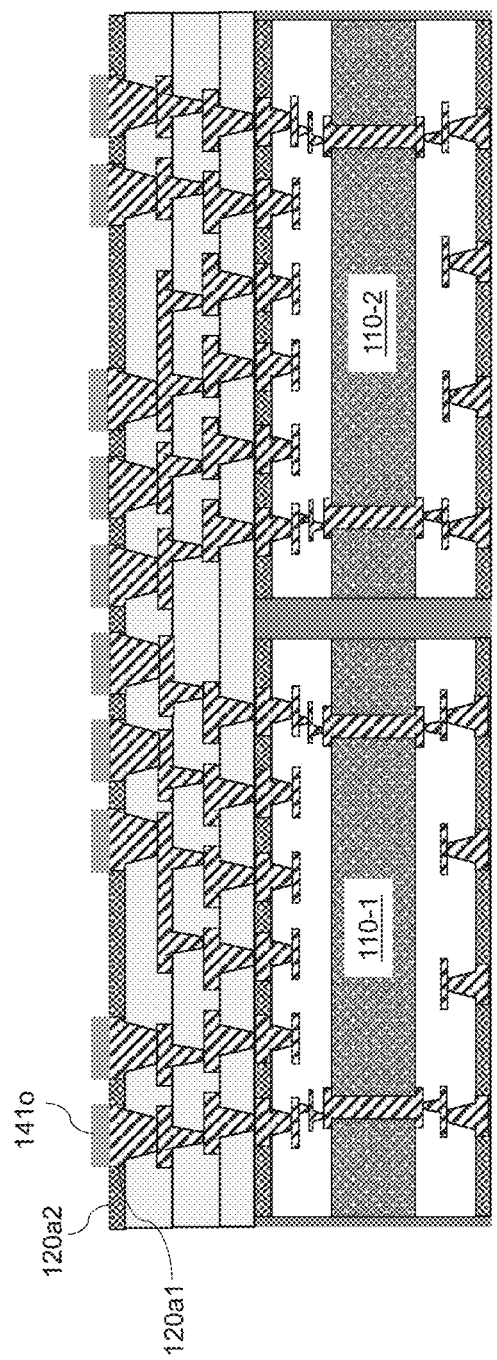
FIG. 6D is a vertical cross-sectional view of an intermediate structure including the pre-solder layers (e.g., C4 pre-solder layers) on the RDL structure, according to one or more embodiments.

FIG. 6D is a vertical cross-sectional view of an intermediate structure including the pre-solder layers 1410 (e.g., C4 pre-solder layers) on the RDL structure 120, according to one or more embodiments. The pre-solder layers 1410 may be formed on the metal bonding pads 120a1, for example, by a plating process or reflowing process. The first glass carrier 291 may then be removed, for example, by decomposing the adhesive layer 291a by heat, UV light, etc. to attain the intermediate structure of FIG. 6D.

Figure 6E:
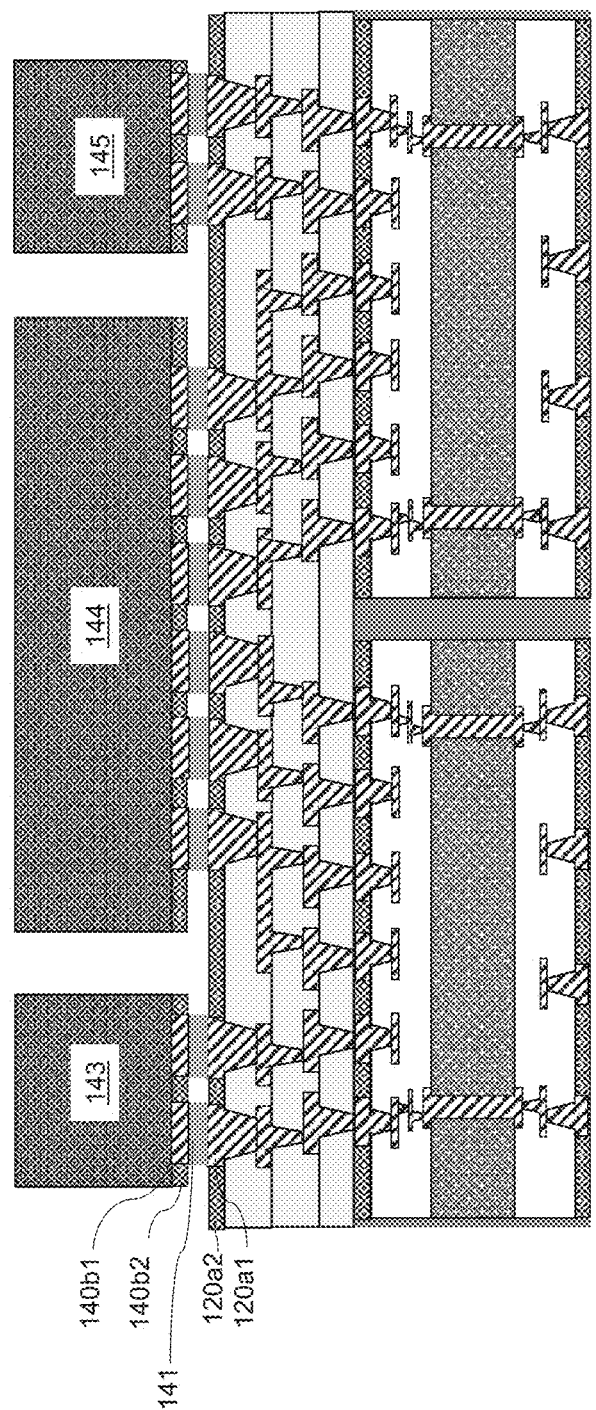
FIG. 6E is a vertical cross-sectional view of an intermediate structure after the mounting of the first semiconductor device, second semiconductor device and third semiconductor device, according to one or more embodiments.

FIG. 6E is a vertical cross-sectional view of an intermediate structure after the mounting of the first semiconductor device 143, second semiconductor device 144 and third semiconductor device 145, according to one or more embodiments. The first semiconductor device 143, second semiconductor device 144 and third semiconductor device 145 may be mounted on the RDL structure 120, for example, by flip chip bonding in a pick and place (PNP) process.

The intermediate structure may be achieved by forming a solder layer (not shown) on the metal bonding pads 140b1 on each of the first semiconductor device 143, second semiconductor device 144 and third semiconductor device 145. The metal bonding pads 140b1 (with the solder layer thereon) may then be aligned with the metal bonding pads 120a1 (with the pre-solder layer 1410 thereon). The first semiconductor device 143, second semiconductor device 144 and third semiconductor device 145 may then be lowered onto the RDL structure 120 so that that solder layer on the metal bonding pads 140b1 may contact the pre-solder layer 1410 on the metal bonding pads 120a1. A reflow process may then be performed to form the solder joint of the bump structures 141 (e.g., micro-bump structures). The intermediate structure may then be allowed to cool so that that the bump structures 141 may constitute a solid interconnection.

Figure 6F:
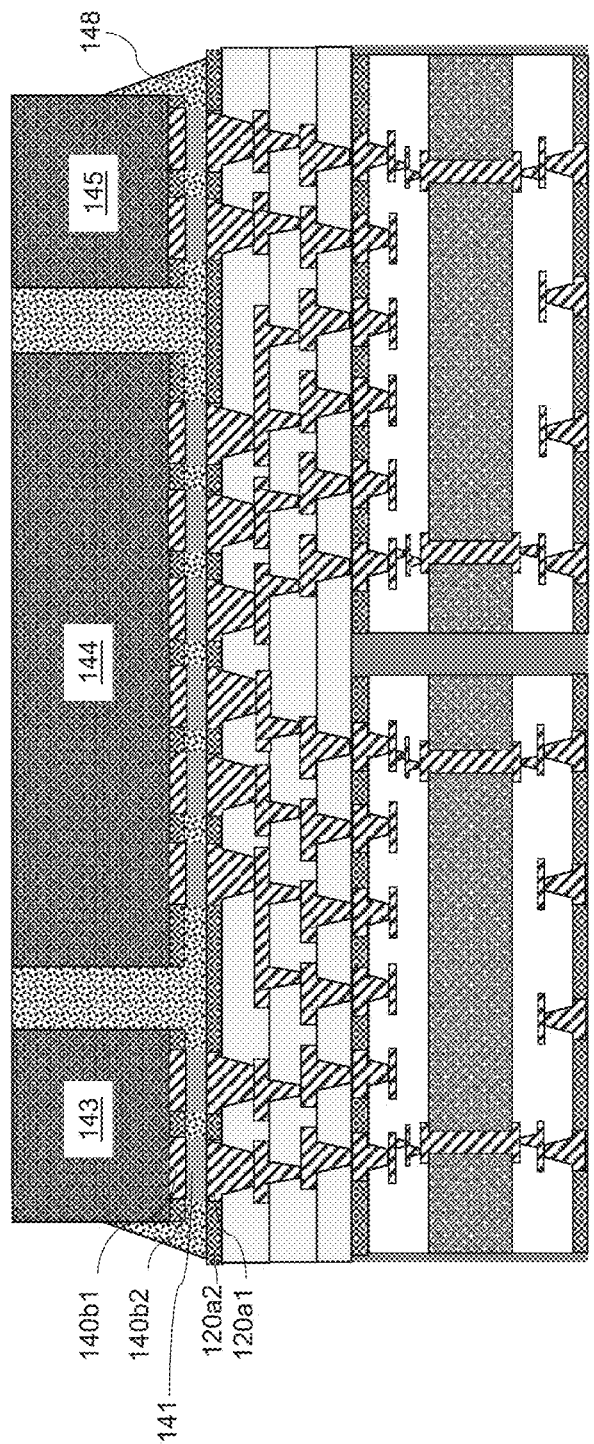
FIG. 6F is a vertical cross-sectional view of an intermediate structure after the forming of the interposer underfill layer 148, according to one or more embodiments.

FIG. 6F is a vertical cross-sectional view of an intermediate structure after the forming of the interposer underfill layer 148, according to one or more embodiments. The interposer underfill layer 148 may be formed by injecting an underfill material (e.g., epoxy-based polymeric material) on the protective layer 120a2 and around the bump structures 141 (e.g., array of bump structures 141). The interposer underfill layer 148 may be formed around the bump structures 141 so as to fix the first, second and third semiconductor devices 143, 144, 145 to the RDL structure 120.

Figure 6G:
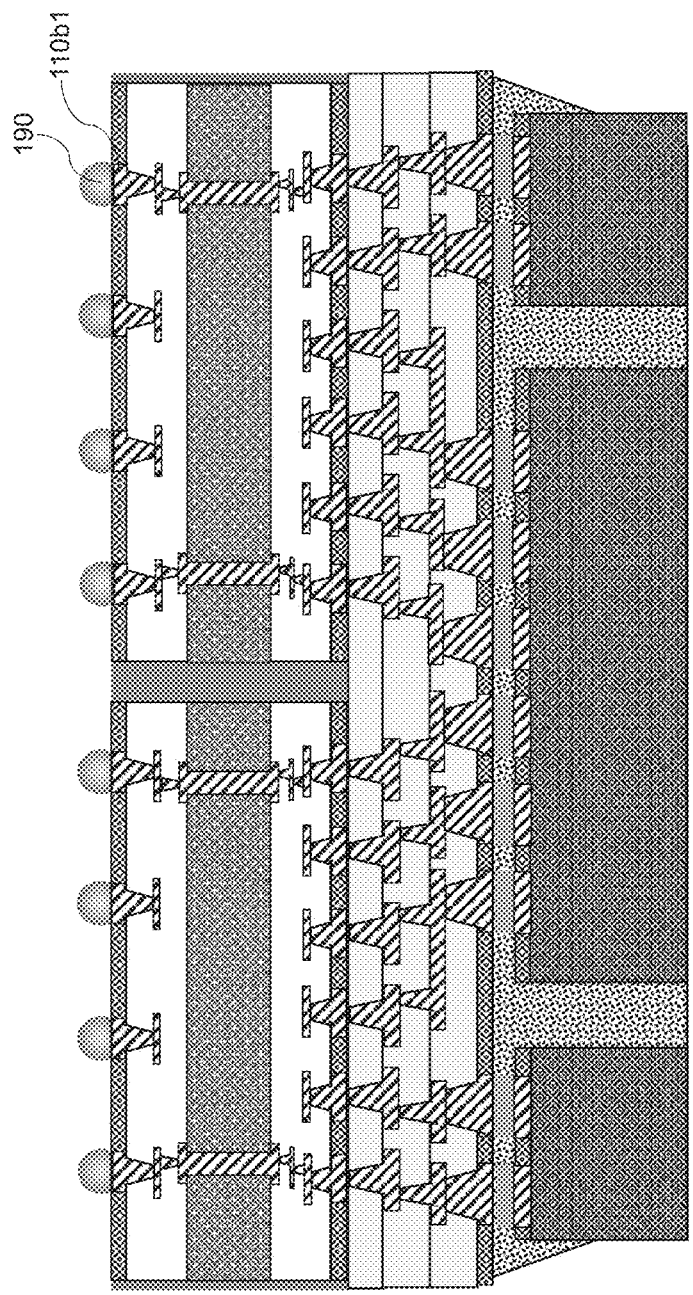
FIG. 6G is a vertical cross-sectional view of the package assembly after the forming a plurality of solder balls on the package substrate, according to one or more embodiments.

FIG. 6G is a vertical cross-sectional view of the package assembly 150 after the forming a plurality of solder balls 190 on the package substrate 115, according to one or more embodiments. To complete the package assembly 150, the intermediate structure of FIG. 6F may be inverted and the plurality of solder balls 190 may be formed on the metal bonding pads 110b1. The plurality of solder balls 190 may be formed, for example, for example, by an automated process such as in computer-controlled automatic reflow ovens.

Figure 7:
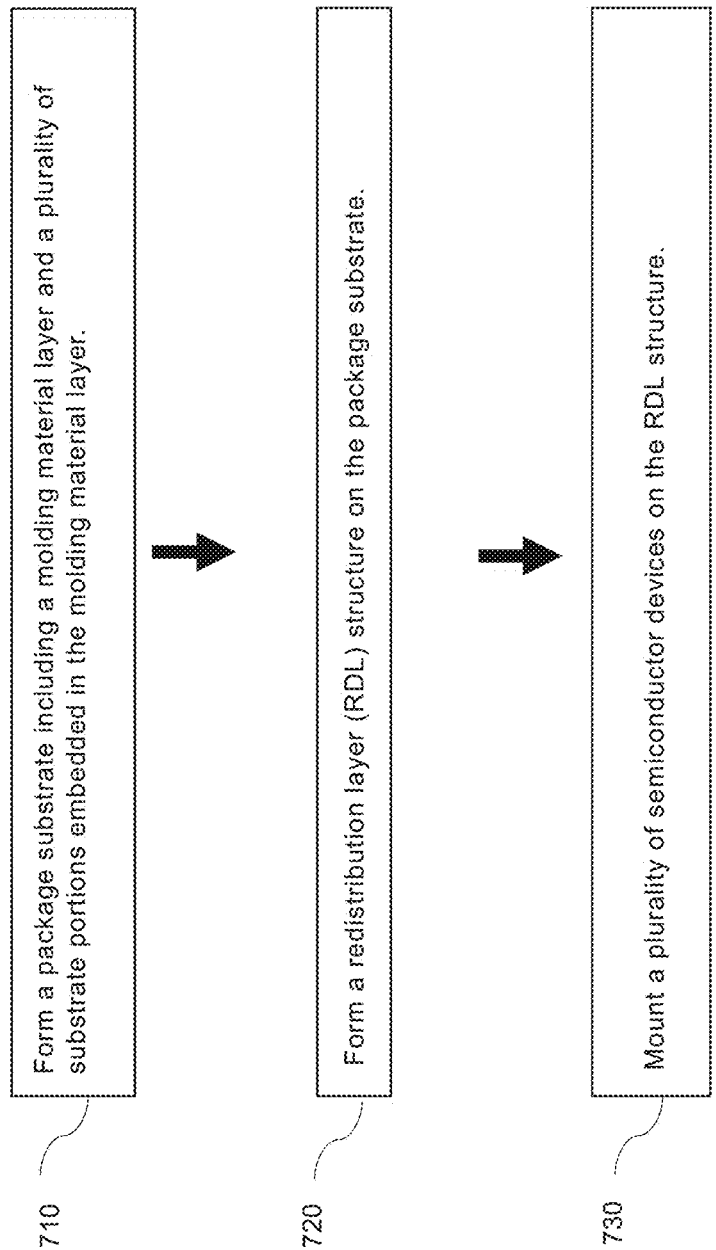
FIG. 7 is a flow chart illustrating a method (e.g., substrate-attach first method) of making the package assembly, according to one or more embodiments.

FIG. 7 is a flow chart illustrating a method (e.g., substrate-attach first method) of making the package assembly 150, according to one or more embodiments. Step 710 may include forming a package substrate including a molding material layer and a plurality of substrate portions embedded in the molding material layer. Step 720 may include forming an RDL structure 120 on the package substrate. Step 730 may include mounting a plurality of semiconductor devices on the RDL structure.

Figure 8A:
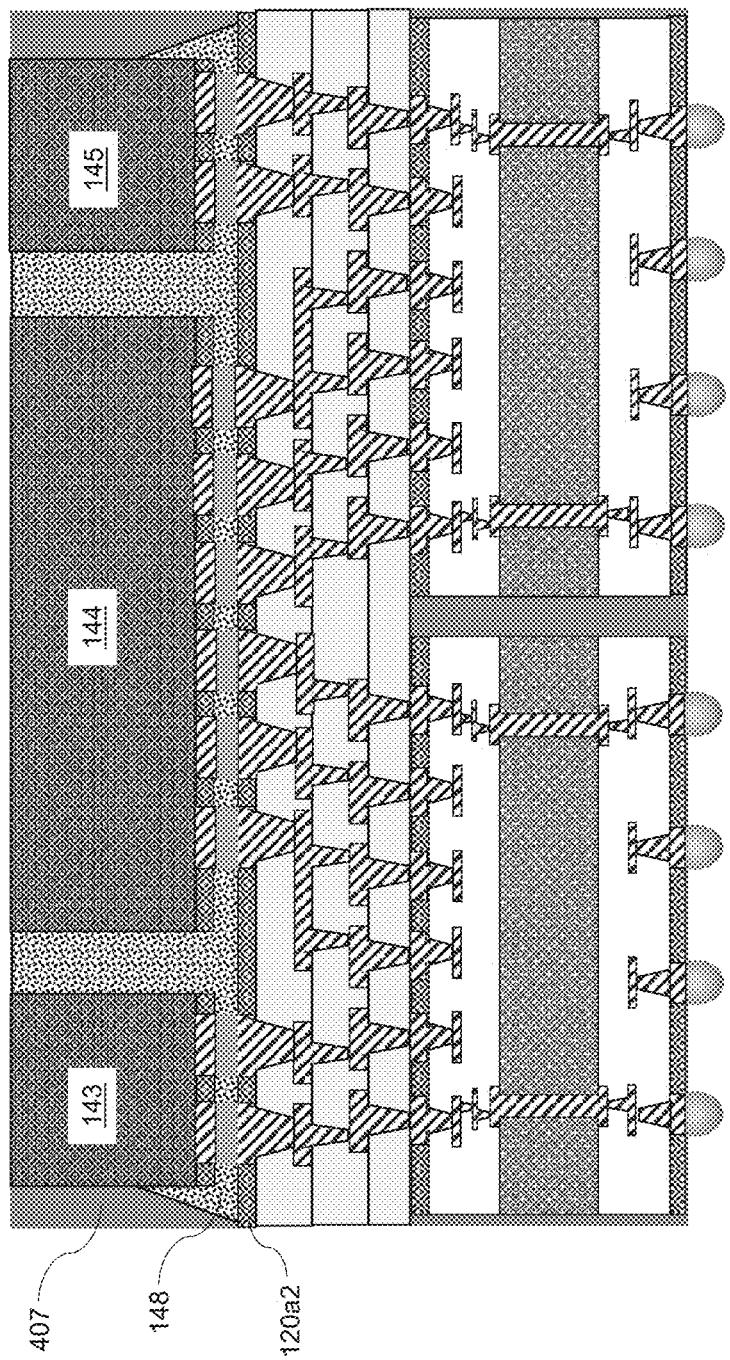
FIG. 8A is a vertical cross-sectional view of a first alternative design of the package assembly, according to one or more embodiments.

FIG. 8A is a first alternative design of the package assembly 150, according to one or more embodiments. The first alternative design may be substantially similar to the design of the package assembly 150 in FIG. 5. However, in addition to the design in FIG. 5, the first alternative design may include the molding material layer 407 (e.g., EMC) formed on the first semiconductor device 143, second semiconductor device 144, and third semiconductor device 145. As with the molding material layer 107, the molding material layer 407 may include an epoxy-containing compound that may be hardened (i.e., cured) to provide a dielectric material portion having sufficient stiffness and mechanical strength. The EMC may include epoxy resin, hardener, silica (as a filler material), and other additives.

The first alternative design may be formed by a method similar to that described above in FIGS. 6A-6G. The molding material layer 407 may be formed, for example, after the mounting of the first semiconductor device 143, second semiconductor device 144 and third semiconductor device (e.g., FIG. 6F), and before the forming of the solder balls 190 (e.g., FIG. 6G). As illustrated in FIG. 8A, the molding material layer 407 may also be formed on the interposer underfill layer 148 and the protective layer 120a2.

Figure 8B:
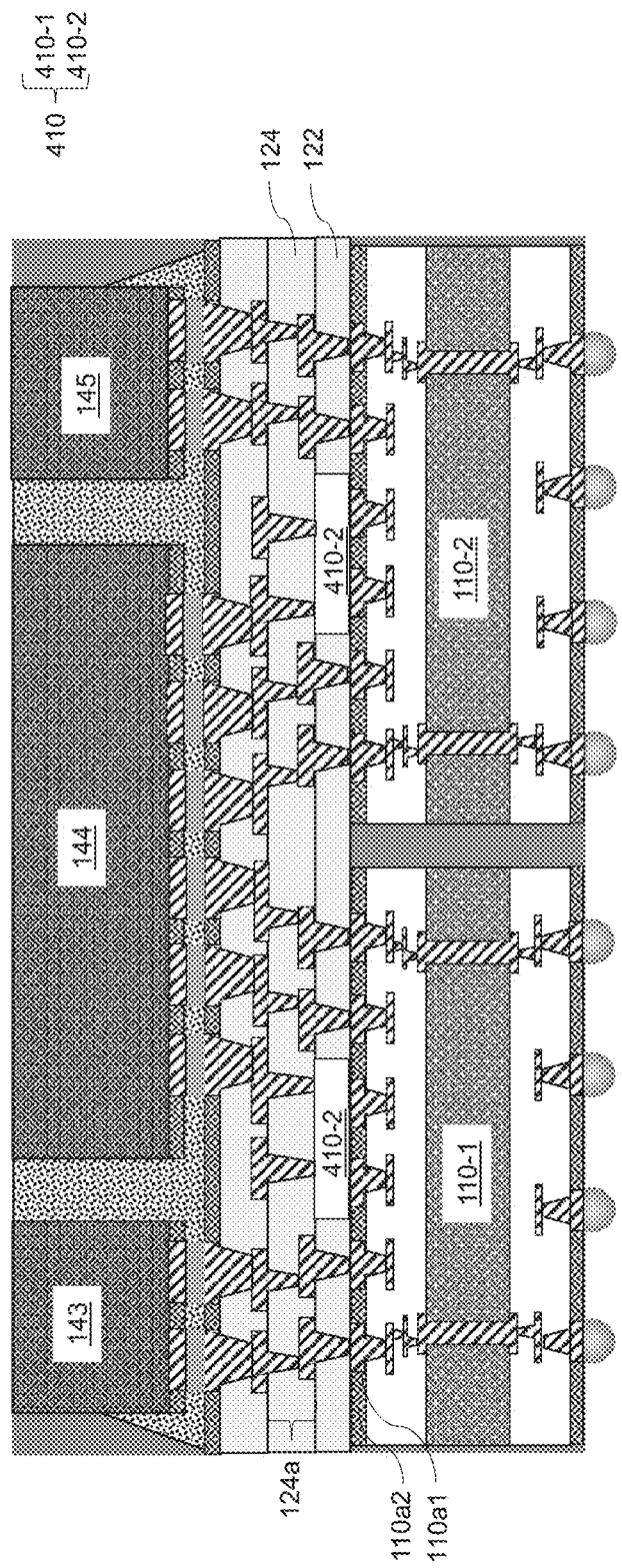
FIG. 8B is a vertical cross-sectional view of a second alternative design of the package assembly, according to one or more embodiments.

FIG. 8B is a second alternative design of the package assembly 150, according to one or more embodiments. The second alternative design may be substantially similar to the first alternative design of the package assembly 150 in FIG. 8A. However, in addition to the first alternative design in FIG. 8A, the second alternative design may include one or more IPDs 410. The IPDs 410 may be formed, for example, in the first dielectric layer 122 of the RDL structure 120. The IPDs 410 may include a first IPD 410-1 located on the first substrate portion 110-1. The IPDs 410 may also include a second IPD 410-2 located on the second substrate portion 110-2.

The first IPD 410-1 and second IPD 410-2 may have a similar or different structure, function and location in the package assembly 150. In one or more embodiments, a bottom surface of the first IPD 410-1 and second IPD 410-2 may contact one or more of the metal bonding pads 110a1 and the protective layer 110a2. The second metal RDL layers 124a in the RDL structure 120 may contact an upper surface of the first IPD 410-1 and the second IPD 410-2.

The second alternative design of the package assembly 150 in FIG. 8B may be made by a method similar to the method described above with respect to FIGS. 6A-6G. However, with the second alternative design, after the forming of the molding material layer 107 in FIG. 6B, the first IPD 410-1 and second IPD 410-2 may be mounted on the metal bonding pads 110a1 and protective layer 110a2. The RDL structure 120 may then be formed over the first IPD 410-1 and second IPD 410-2 (e.g., see FIG. 6C). The method may then proceed as described above with respect to FIGS. 6D-6G.

Figure 8C:
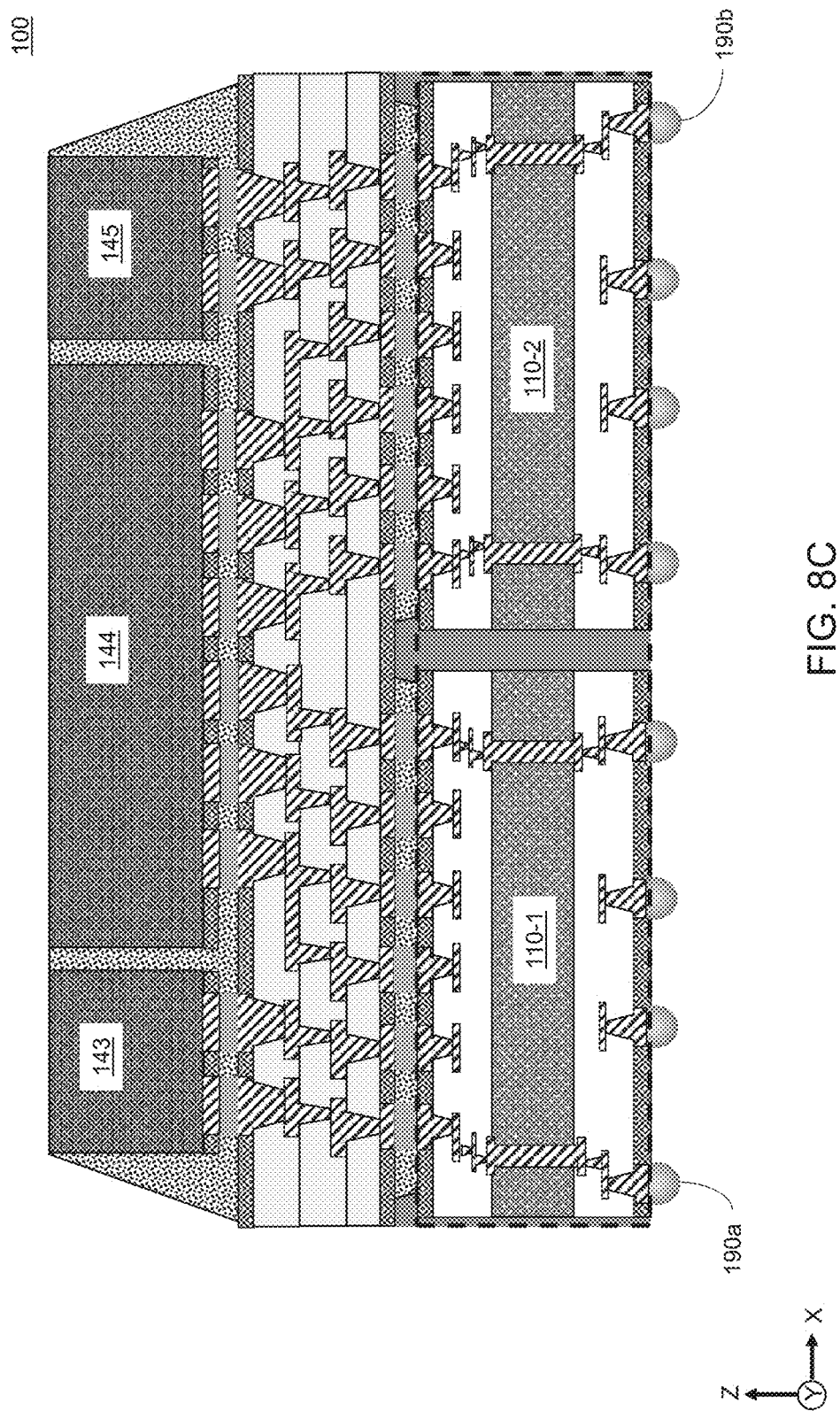
FIG. 8C is a third alternative design of the package assembly, according to one or more embodiments.

FIG. 8C is a third alternative design of the package assembly 100, according to one or more embodiments. As illustrated in FIG. 8C, in the third alternative design, the first substrate portion 110-1 may be configured so that the outermost solder ball 190a connected to the first substrate portion 110a-1 may be outside the outer sidewall of the first semiconductor device 143 in the X-direction. The second substrate portion 110-2 may be configured so that the outermost solder ball 190b connected to the second substrate portion 110a-2 may be outside the outer sidewall of the third semiconductor device 145 in the X-direction. The third alternative design may be especially helpful for providing good support where the package assembly 100 includes an integrated fan-out (INFO) structure.

Referring to FIGS. 1A-8C, a package assembly 100, 150 may include a package substrate 115 including a molding material layer 107 and a plurality of substrate portions 110, 110-1, 110-2 embedded in the molding material layer 107, a redistribution layer (RDL) structure 120 on the package substrate 115, and a plurality of semiconductor devices 143, 144, 145 on the RDL structure 120. In an embodiment, the plurality of substrate portions 110, 110-1, 110-2 may be substantially aligned in a longitudinal direction. In an embodiment, the plurality of semiconductor devices 143, 144, 145 may include a system on chip (SOC) device 144 and a plurality of high bandwidth memory (HBM) devices 143, 145. In an embodiment, the SOC device 144 may bridge the plurality of substrate portions 110, 110-1, 110-2 and the plurality of HBM devices 143, 145 may be located on opposing ends of the SOC device 144 in the longitudinal direction. In an embodiment, the molding material layer 107 may include an epoxy molding compound (EMC). In an embodiment, the molding material layer 107 may include an outer molding material layer portion 107o that may be formed around a perimeter of the plurality of substrate portions 110, 110-1, 110-2. In an embodiment, the molding material layer 107 may further include a central molding material layer portion 107c that may be formed between the plurality of substrate portions 110, 110-1, 110-2 and connects opposing sides of the outer molding material layer portion 107o. In an embodiment, the central molding material layer portion 107c may include a width in a range from 0.5 mm to 5.0 mm and the outer molding material layer portion 107o may include a width in a range from 0.05 mm to 1.00 mm. In an embodiment, the molding material layer 107 may be bonded to a bottom surface of the RDL structure 120. In an embodiment, the package assembly 100 may further include a plurality of bump structures 131 that connect the RDL structure 120 to the plurality of substrate portions 110, 110-1, 110-2. In an embodiment, the package assembly 100 may further include an underfill layer 132, 132-1, 132-2 between the RDL structure 120 and the plurality of substrate portions 110, 110-1, 110-2, and around the plurality of bump structures 131. In an embodiment, the RDL structure 120 may include a first RDL layer contacting an upper surface of the package substrate 115 and including a plurality of metal RDL vias 122a that electrically connect the RDL structure 120 to the package substrate 115. In an embodiment, the package substrate 115 may include a plurality of package substrate upper bonding pads 110a1 on the upper surface of the package substrate 115, and the plurality of metal RDL vias 122a may contact the plurality of package substrate upper bonding pads, respectively.

Referring to FIGS. 2A-2J and FIGS. 6A-6G, a method of forming a package assembly 100, 150 may include forming a package substrate 115 including a molding material layer 107 and a plurality of substrate portions 110, 110-1, 110-2 embedded in the molding material layer 107, forming a redistribution layer (RDL) structure, and mounting a plurality of semiconductor devices 143, 144, 145 on the RDL structure 120 and the package substrate 115. In an embodiment, the forming of the RDL structure 120 may be performed before the forming of the package substrate 115. In an embodiment, the forming of the package substrate 115 may include mounting the plurality of substrate portions 110, 110-1, 110-2 on a bottom surface of the RDL structure 120 by a plurality of bump structures 131, forming an underfill layer 132, 132-1, 132-2 between the RDL structure 120 and the package substrate 115, and around the plurality of bump structures 131, and applying the molding material layer 107 around the plurality of substrate portions 110, 110-1, 110-2 and between the plurality of substrate portions 110, 110-1, 110-2 so as to embed the plurality of substrate portions 110, 110-1, 110-2 in the molding material layer 107. In an embodiment, the forming of the package substrate 115 may be performed before the forming of the RDL structure 120. In an embodiment, the forming of the package substrate 115 may include placing the plurality of substrate portions 110, 110-1, 110-2 on a glass carrier, and applying the molding material layer 107 around the plurality of substrate portions 110, 110-1, 110-2 and between the plurality of substrate portions 110, 110-1, 110-2 so as to embed the plurality of substrate portions 110, 110-1, 110-2 in the molding material layer 107. In an embodiment, the forming of the RDL structure 120 may include forming a first RDL layer 122a of the RDL structure 120 on an upper surface of the package substrate 115, and forming in the first RDL layer 122a a plurality of metal RDL vias that electrically connect the RDL structure 120 to the package substrate 115.

Referring to FIGS. 1A-8C, a package assembly 100, 150 may include a re-constructed package substrate 115 that may include a plurality of substrate sections 110, 110-1, 110-2 that may be substantially aligned in a lengthwise direction, and a molding material layer 107 may include an outer molding material layer portion 107o that may be formed around an entire perimeter of the plurality of substrate sections 110, 110-1, 110-2 in a plan view, and a central molding material layer portion 107c that may be formed between the plurality of substrate sections 110, 110-1, 110-2 and connects opposing sides of the outer molding material layer portion 107o in the plan view, and a redistribution layer (RDL) structure 120 on the re-constructed package substrate 115, and a plurality of semiconductor devices 143, 144, 145 that are flip chip bonded on the RDL structure 120, the plurality of semiconductor devices 143, 144, 145 may include a system on chip (SOC) device 144 that bridges the plurality of substrate sections, and a plurality of high bandwidth memory (HBM) devices 143, 145 located on opposing ends of the SOC device 144 in the longitudinal direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package assembly comprising:
    a package substrate comprising a molding material layer and a plurality of substrate portions embedded in the molding material layer, wherein the plurality of substrate portions comprises a plurality of metal bonding pads and a bottom surface of the plurality of metal bonding pads is substantially co-planar with a bottom surface of the molding material layer;
    a redistribution layer (RDL) structure on the package substrate, wherein an outer sidewall of the RDL structure is substantially aligned with an outer sidewall of the molding material layer;
    a plurality of semiconductor devices on the RDL structure; and
    a ball grid array contacting the bottom surface of the metal bonding pads.

2. The package assembly of claim 1, wherein the plurality of substrate portions are substantially aligned in a longitudinal direction.

3. The package assembly of claim 2, wherein the plurality of semiconductor devices comprises a system on chip (SOC) device and a plurality of high bandwidth memory (HBM) devices.

4. The package assembly of claim 3, wherein the SOC device bridges the plurality of substrate portions and the plurality of HBM devices are located on opposing ends of the SOC device in the longitudinal direction.

5. The package assembly of claim 1, wherein the molding material layer comprises an epoxy molding compound (EMC).

6. The package assembly of claim 1, wherein the molding material layer comprises an outer molding material layer portion that is formed around a perimeter of the plurality of substrate portions.

7. The package assembly of claim 6, wherein the molding material layer further comprises a central molding material layer portion that is formed between the plurality of substrate portions and connects opposing sides of the outer molding material layer portion.

8. The package assembly of claim 7, wherein the central molding material layer portion has a width in a range from 0.5 mm to 5.0 mm and the outer molding material layer portion has a width in a range from 0.05 mm to 1.0 mm.

9. The package assembly of claim 1, wherein the molding material layer is bonded to a bottom surface of the RDL structure.

10. The package assembly of claim 1, further comprising a plurality of bump structures that connect the RDL structure to the plurality of substrate portions.

11. The package assembly of claim 10, further comprising an underfill layer between the RDL structure and the plurality of substrate portions, and around the plurality of bump structures.

12. The package assembly of claim 1, wherein the RDL structure comprises a first RDL layer contacting an upper surface of the package substrate and including a plurality of metal RDL vias that electrically connect the RDL structure to the package substrate.

13. The package assembly of claim 12, wherein the package substrate comprises a plurality of package substrate upper bonding pads on the upper surface of the package substrate, and the plurality of metal RDL vias contact the plurality of package substrate upper bonding pads, respectively.

14. A package assembly comprising:
a re-constructed package substrate comprising:
a plurality of substrate sections that are substantially aligned in a lengthwise direction; and
a molding material layer comprising:
an outer molding material layer portion that is formed around an entire perimeter of the plurality of substrate sections in a plan view; and
a central molding material layer portion that is formed between the plurality of substrate sections and connects opposing sides of the outer molding material layer portion in the plan view; and
a redistribution layer (RDL) structure on the re-constructed package substrate; and
a plurality of semiconductor devices that are flip chip bonded on the RDL structure, the plurality of semiconductor devices comprising:
a system on chip (SOC) device that bridges the plurality of substrate sections; and
a plurality of high bandwidth memory (HBM) devices located on opposing ends of the SOC device in the longitudinal direction.

15. A package structure comprising:
a reconstructed substrate including a molding material layer and a plurality of substrate sections in the molding material layer, wherein the plurality of substrate sections comprises:
a dielectric layer having a bottom surface substantially aligned with a bottom surface of the molding material layer; and
a plurality of metal bonding pads in the dielectric layer and having a bottom surface substantially co-planar with the bottom surface of the dielectric layer and the bottom surface of the molding material layer;
a redistribution layer (RDL) structure on the reconstructed substrate, wherein an outer sidewall of the RDL structure is substantially aligned with an outer sidewall of the molding material layer;
a plurality of semiconductor dies on the RDL structure; and
a ball grid array contacting the bottom surface of the plurality of metal bonding pads.

16. The package structure of claim 15, wherein the RDL structure comprises a plurality of dielectric layers and a plurality of metal layers in the plurality of dielectric layers.

17. The package structure of claim 16, wherein the RDL structure further comprises a plurality of metal vias connecting the plurality of metal layers.

18. The package structure of claim 17, further comprising:
a plurality of bump structures connecting the RDL structure to the plurality of substrate sections; and
an underfill layer around the plurality of bump structures, wherein the molding material layer is around the underfill layer.

19. The package structure of claim 16, wherein the plurality of substrate sections comprises a plurality of cored substrate sections.

20. The package structure of claim 15, wherein a semiconductor die of the plurality of semiconductor dies is electrically coupled to the plurality of substrate sections.

* * * * *